United States Patent [19]

Graves, Jr. et al.

[11] 4,313,815
[45] Feb. 2, 1982

[54] SPUTTER-COATING SYSTEM, AND VACCUUM VALVE, TRANSPORT, AND SPUTTER SOURCE ARRAY ARRANGEMENTS THEREFOR

[75] Inventors: Walter E. Graves, Jr., San Jose; Donald Boys, Cupertino; Frederick T. Turner, Sunnyvale, all of Calif.

[73] Assignee: Varian Associates, Inc., Palo Alto, Calif.

[21] Appl. No.: 894,287

[22] Filed: Apr. 7, 1978

[51] Int. Cl.³ .............................................. C23C 15/00
[52] U.S. Cl. ................................. 204/298; 204/192 R
[58] Field of Search .................. 204/298; 118/49, 729; 251/56, 193, 215, 226

[56] References Cited

U.S. PATENT DOCUMENTS

| | | | |
|---|---|---|---|
| 3,904,506 | 9/1975 | Carmichael et al. | 204/298 |
| 3,911,579 | 10/1975 | Lane et al. | 30/346.54 |
| 3,968,018 | 7/1976 | Lane et al. | 204/192 |
| 3,973,753 | 8/1976 | Wheeler | 251/204 |
| 4,100,055 | 7/1978 | Rainey | 204/298 |

FOREIGN PATENT DOCUMENTS

| | | | |
|---|---|---|---|
| 2350322 | 4/1975 | Fed. Rep. of Germany | 204/298 |
| 47-15202 | 5/1972 | Japan | 204/298 |

OTHER PUBLICATIONS

D. B. Fraser et al., "Film Deposition with the Sputter Gun", *J. Vac. Sci. Technol.*, vol. 14, No. 1, (Jan./Feb. 1977), pp. 147–151.
John L. Vossen et al., *Thin Film Processes*, Academic Press, New York, 1978, pp. 126–128.
Leon I. Maissel et al., *Handbook of Thin Film Technology*, McGraw-Hill, New York, 1970, pp. 4-13 to 4-15.
Dennis Hajzak, "Practical Techniques for Improving Sputtered Film Quality", *J. Vac. Sci. Technol.*, vol. 7, No. 1, (Jan./Feb. 1970), pp. 224–227.
G. F. Barber, Two-Chamber Air-to-Vacuum Lock System, IBM Tech. Disc. Bulletin, vol. 11, No. 7, Dec. 1968, p. 757.

*Primary Examiner*—Andrew Metz
*Assistant Examiner*—William Leader
*Attorney, Agent, or Firm*—Stanley Z. Cole; Peter J. Sgarbossa

[57] ABSTRACT

Relatively wide workpieces, such as auto grilles, are rapidly conveyed into and from a vacuum processing chamber provided with entry and exit air locks and vacuum isolation valves, in which thin metallic coatings are deposited uniformly over workpiece surfaces. The gate member of the valve is supported for sliding vertical movement, as well as limited outward and inward movement for sealing the chamber opening, at the protruding ends of an elongated member backing the gate. Air cylinders act directly on these ends to close the gate. A linkage and air cylinder above the gate vertically propels the gate. The processing chamber is provided with several side by side arrays of sputtering sources with circular cathodes, the workpieces moving thereunder at a steady rate orthogonally to the arrays. The spacings of each source relative to the other in each array, the workpiece to source distance, and the degree of outboard placement of the outer sources relative to the workpiece edges are defined to provide both even coatings on horizontal workpiece surfaces, as well as on the vertical surfaces. A compact conveyor system with space-saving corner modules is coordinated with the valve action to maintain an even steady flow through the evacuated processing chamber for optimum coating.

9 Claims, 17 Drawing Figures

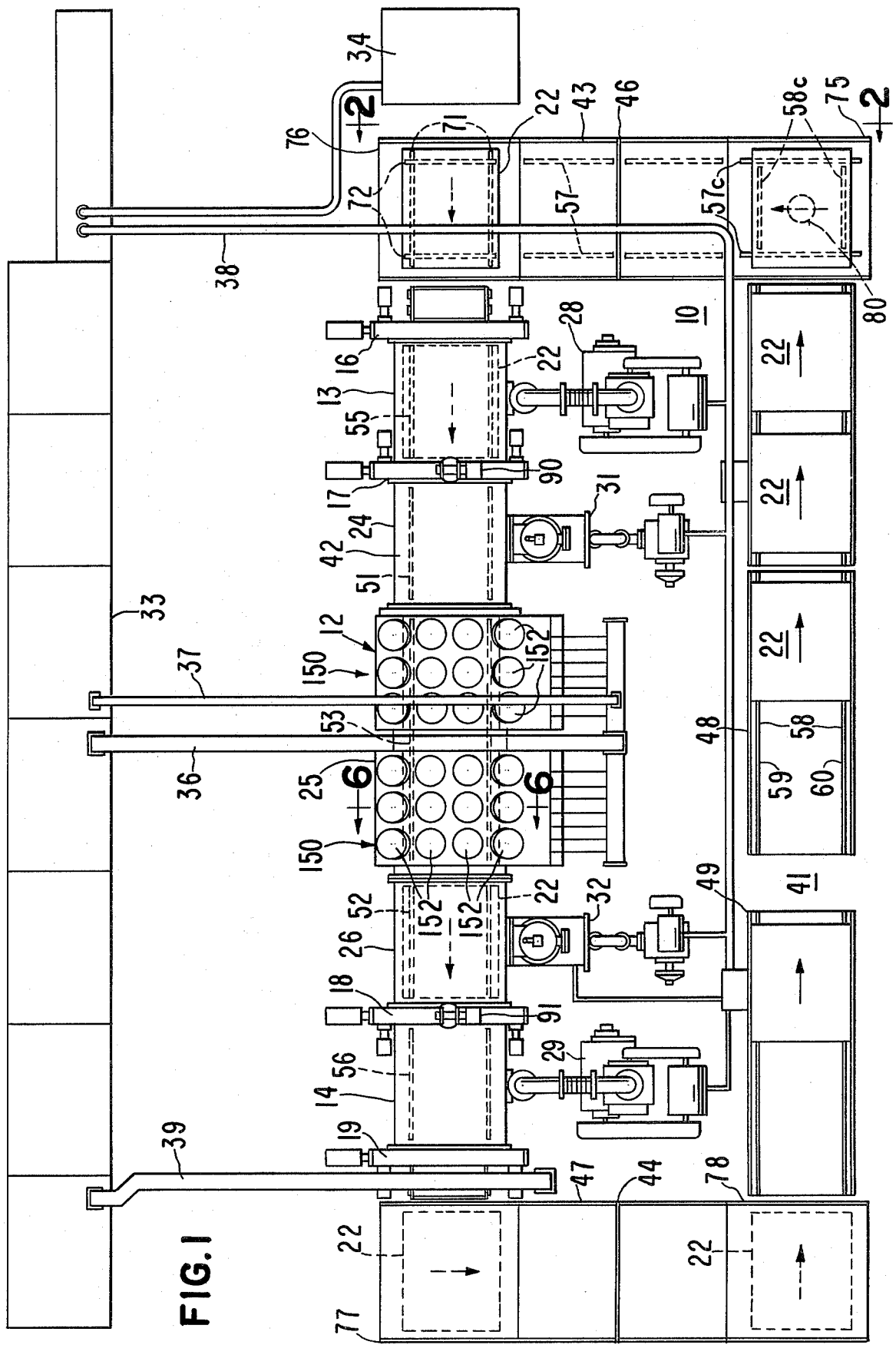

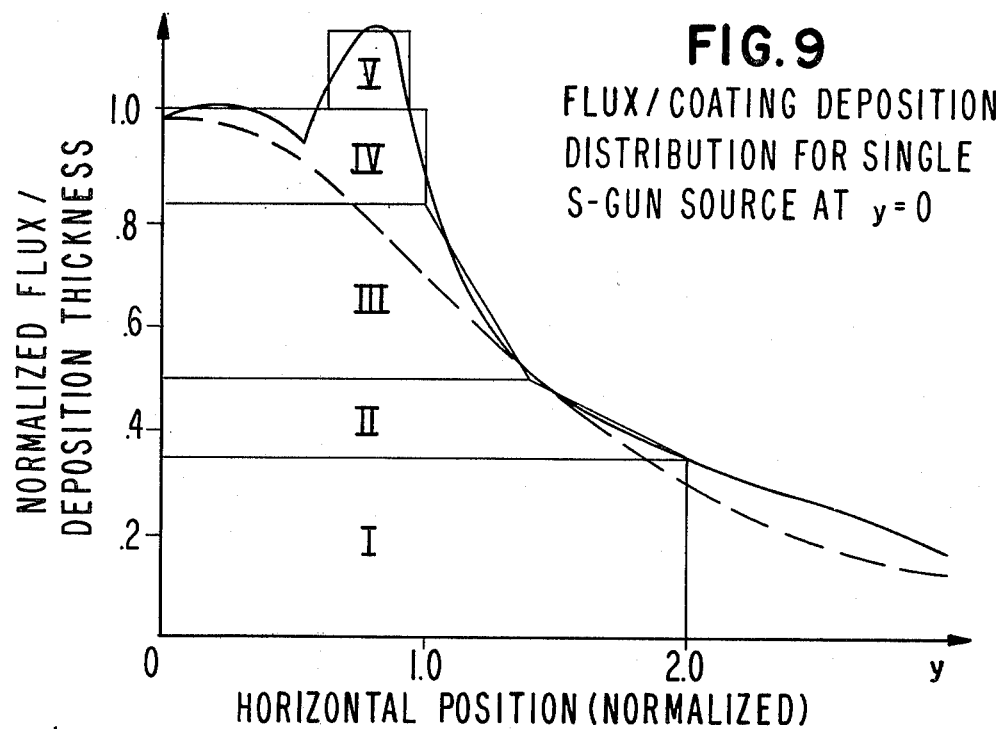
FIG. 9 FLUX/COATING DEPOSITION DISTRIBUTION FOR SINGLE S-GUN SOURCE AT $y=0$
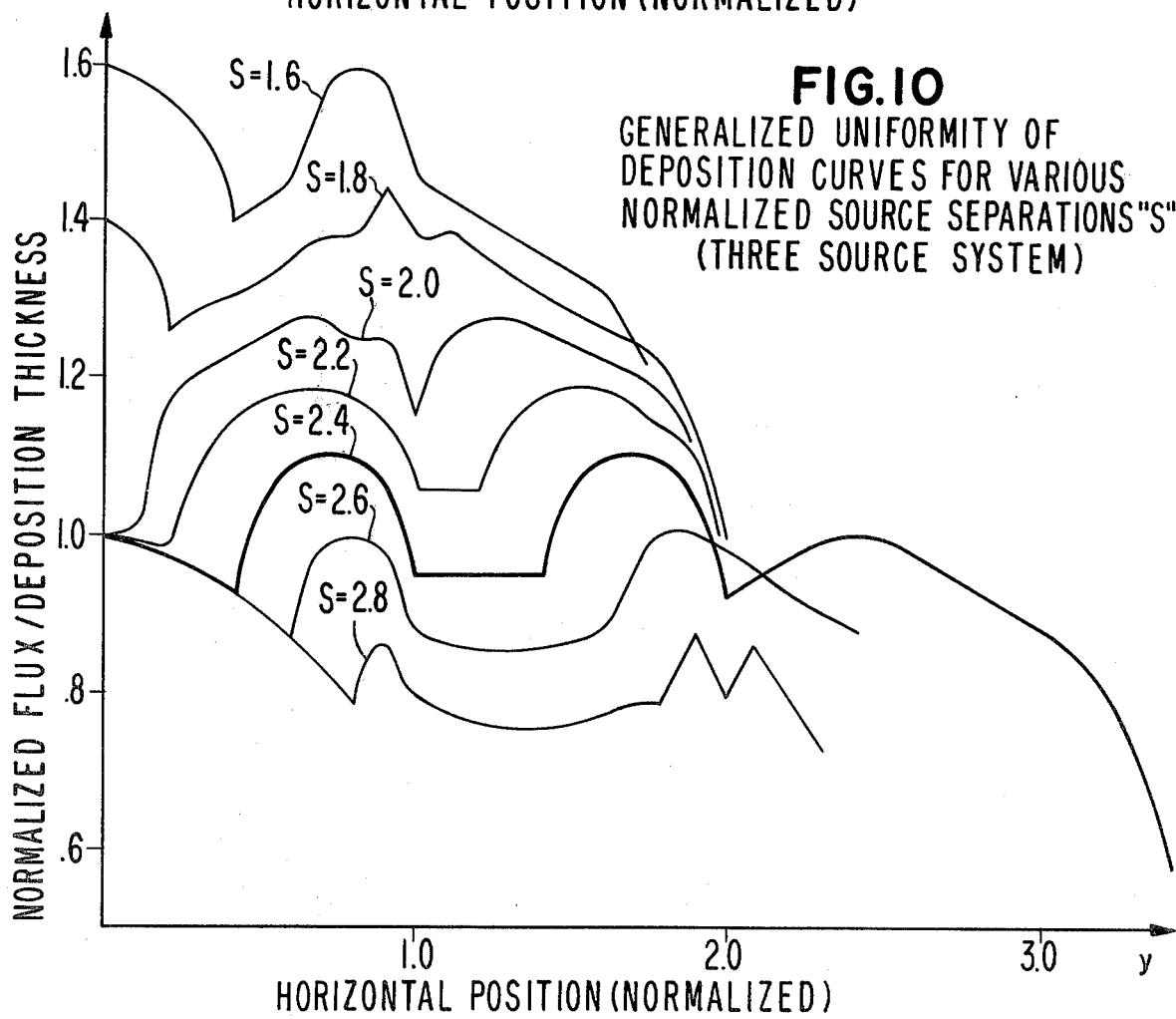
FIG. 10 GENERALIZED UNIFORMITY OF DEPOSITION CURVES FOR VARIOUS NORMALIZED SOURCE SEPARATIONS "S" (THREE SOURCE SYSTEM)

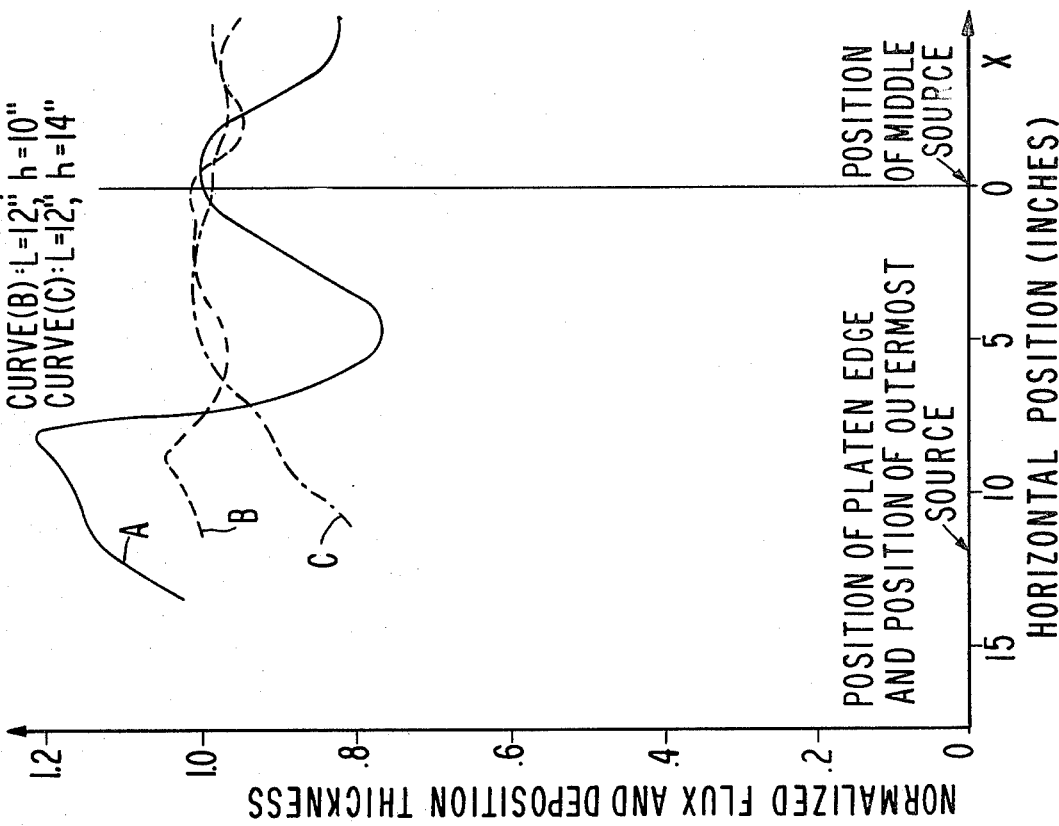
FIG.12 MEASURED HORIZONTAL DEPOSITION UNIFORMITY THREE SOURCE ARRAY
CURVE(A): L=12", h=8"
CURVE(B): L=12", h=10"
CURVE(C): L=12", h=14"
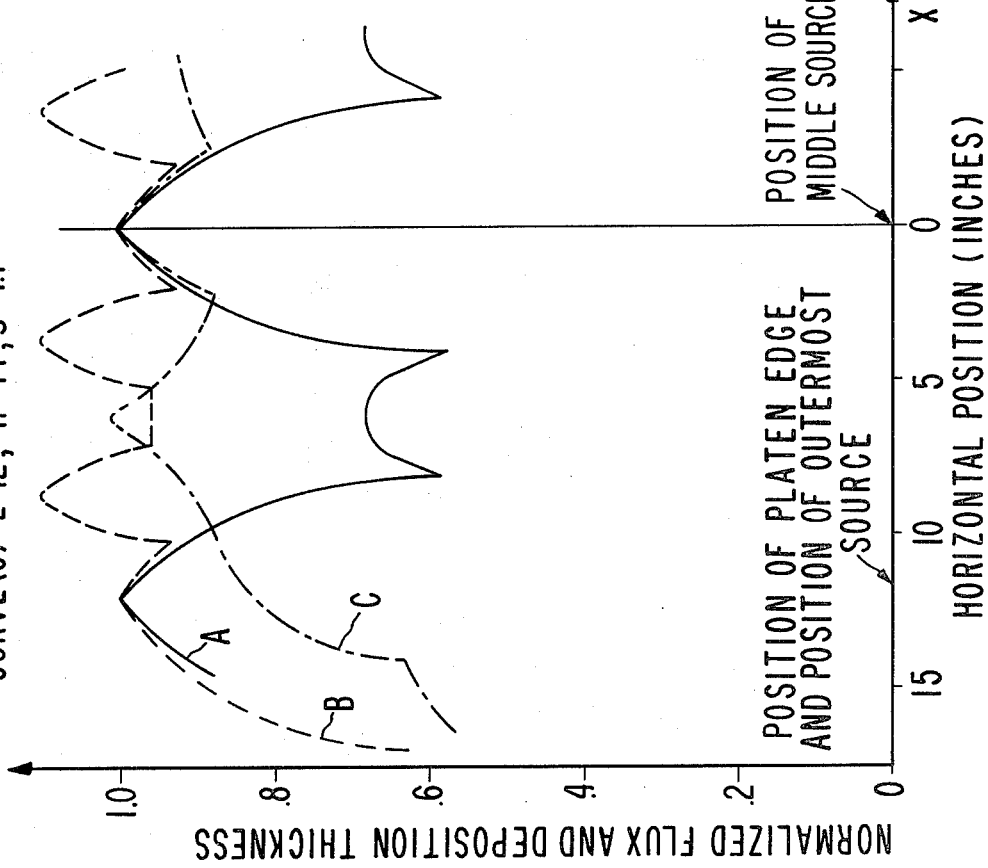
FIG.11 CALCULATED HORIZONTAL DEPOSITION UNIFORMITY THREE SOURCE ARRAY
CURVE(A): L=12", h=8", s=3.0
CURVE(B): L=12", h=10", s=2.4
CURVE(C): L=12", h=14", s=1.7

DIRECTION OF TRAVEL

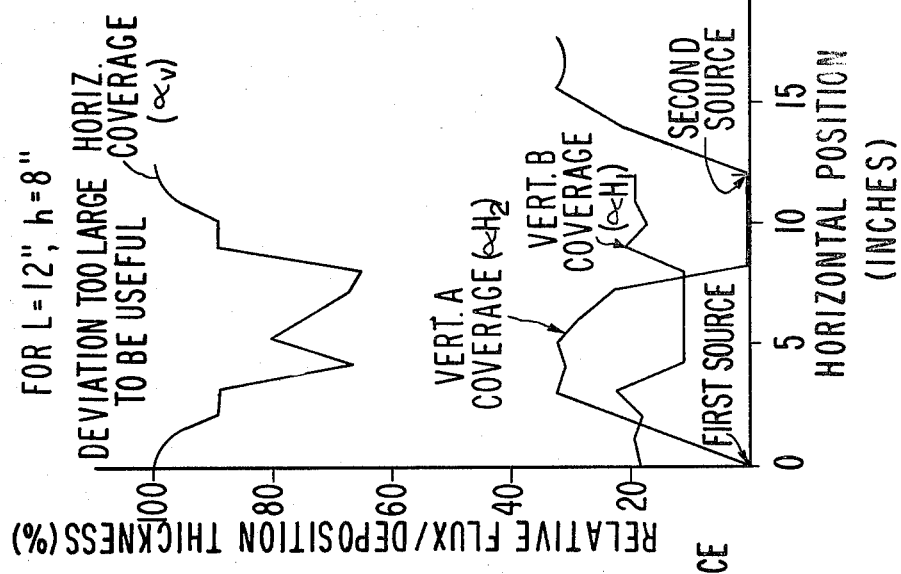
FIG. 17
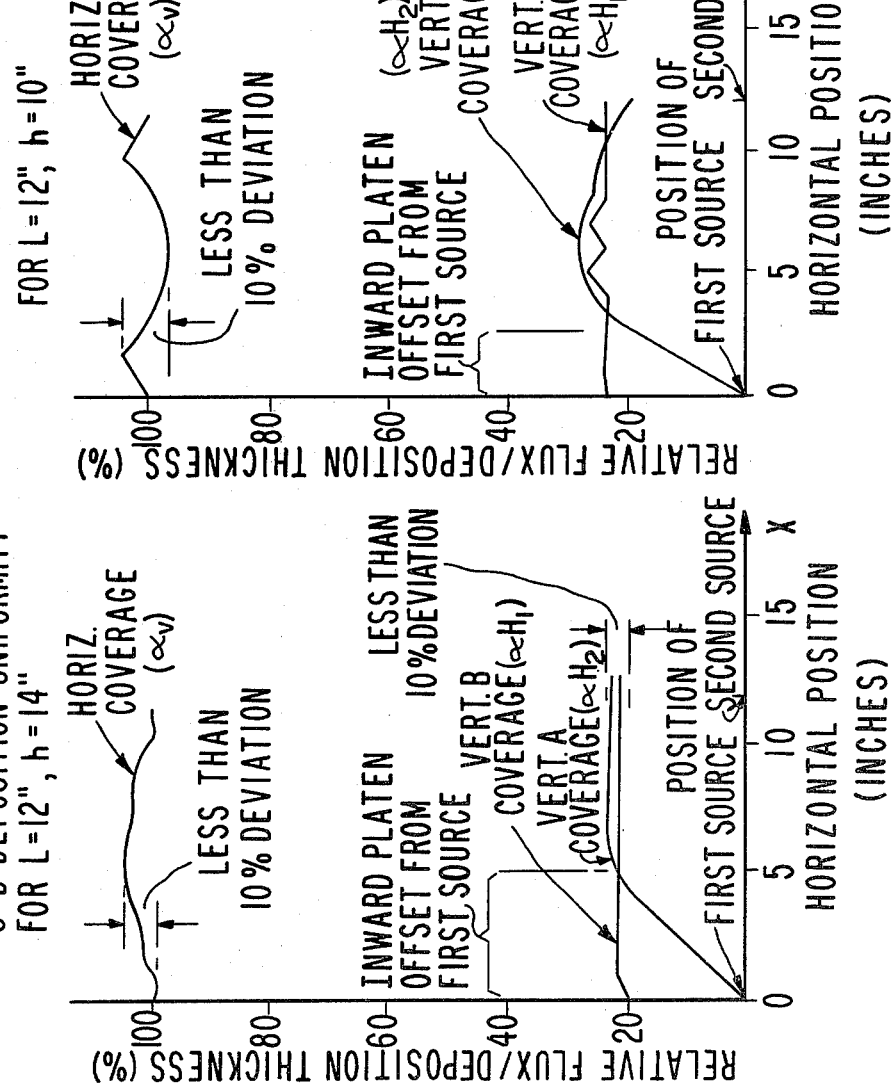
FIG. 16
FIG. 15

SPUTTER-COATING SYSTEM, AND VACCUUM VALVE, TRANSPORT, AND SPUTTER SOURCE ARRAY ARRANGEMENTS THEREFOR

BACKGROUND OF THE INVENTION

1. Field of the Invention

This invention relates to systems for applying a thin metallic coating to articles being processed in a continuous high throughout manner, and more particularly to vacuum chamber coating systems, workpiece transport, vacuum valving arrangements and multiple sputter source arrays therefor, for continuously handling and uniformly coating across work pieces of large area and width.

2. Description of the Prior Art

Arrangements for continuous coating of work pieces by vacuum processing techniques such as sputtering have evolved from variations on the original bell jar to rather sophisticated in-line systems, with air locks to enable the atmosphere in the coating area of the system to be controlled, and special conveyers cooperating with complex positioning or loading means and valving means.

Many of such continuous processing systems have been devised for smaller work pieces such as substrates or wafers for solid state electronic component fabrication. Recently, advances in the efficiency, uniformity of deposition, and speed of sputtering sources (see for example, pending U.S. application Ser. No. 805,485 filed June 10, 1977 to R. M. Rainey for "Target Profile for Sputtering Apparatus") now issued as U.S. Pat. No. 4,100,055 have made it possible to consider the metalization of workpieces of larger area by the sputtering process, on a production line continuous basis.

However, it has normally been required to impose rotational or other complex motion to the object being coated. This is an elaborate mechanical requirement which is unsuitable in a system to be run on a production line continuous basis. Other systems have attempted to make use of non-circular "line" sources to provide the coating material, but such sources have not provided the requisite degree of uniformity over wide horizontal workpieces, nor have they provided a suitable level of uniformity and coverage for both vertical and horizontal surfaces of wide workpieces. For the same reasons of problems with coverage and uniformity, arrays of circular-cathode sputtering sources for wide workpieces have not been successful. Furthermore, the vacuum isolation valves and transport systems for such prior systems have not proved very suitable for handling large workpieces, because of the special problems unique to the vacuum processing of wide workpieces.

As noted, because the coating process is conducted in a controlled atmosphere, typically one which is evacuated to low pressure, and which can have in addition a rare (inert) gas at low pressure, air locks must be employed, and isolation valves utilized. These in turn must interface with conveyer apparatus transporting work pieces into the system on a continuous basis. The requirements of size of work piece and high throughput impose conflicting requirements which the design of the system must address. Since the workpieces are large in width, the isolation valve must be of large capacity. Yet the valve may not be axially deep (in the direction of the path of the work pieces), since the valve constitutes a discontinuity in the conveying system which must be made small in order not to inhibit the transport of workpieces through the valve, or increase the time needed to evacuate a given airlock.

Moreover, the increased area and capacity of the valve mean that greatly increased strength is needed to maintain the required level of controlled atmosphere. Again, this conflicts with the need to maintain compactness, as well as the need to keep at a minimum the initial mass of the valve, since stress and wear during continuous operation must be minimized for reliability. Another similar, difficult to address need is to keep the space above and across the conveying means immediately ahead of the valve free of any possibility of interference with the opening and closing of the isolation valve. This must be the case in order to permit workpieces to be advanced continuously to points proximate the valve, so that a continuous feed for high throughput is feasible.

Prior isolation valves have fallen short of these requirements, especially in capacity for admitting workpieces of large frontal area, and particularly width. None have had a means for distributing the sealing forces evenly about an elongated or wide gate member without undue interference with the space ahead of the gate, through which workpieces would be approaching in a production system. Thus, designs may be seen with a plurality of air cylinders bearing on various points of the closure member, or having lever arms bearing centrally or toward the sides of the closure member, and positioned, at least in the closed position, in a manner potentially interfering with the progress of work pieces on any adjacent conveying means. Also, prior valves, because of such closure mechanism designs, have not been of an overall thinness to assure that conveyer means on either side of the valve would be separated by a gap small enough not to inhibit the transport of work pieces.

Further, the means by which the closure members of such prior valves have been supported have not been designed to withstand the high inertial loads and consequent wear of rapid cycling, especially with larger valve components of a higher capacity design. Typically such means as pivots, either at one point or acting at two points along an upper edge, have been used to support the closure member. This has made it difficult to completely clear the gate for a more compact design, and to alleviate loading and stress in larger capacity designs.

A successful sputter-coating system with continuous rapid throughput of large workpieces also of course requires that all components be of the greatest possible simplicity, reliability, and responsiveness to command signals. For example, the valve should have a minimum of moving parts, while the conveying means must be capable of working at varying rates, and have the capacity to transfer workpieces within a small area, including the capacity for moving wide workpieces in a compact folded path. Prior systems have not been found to have these attributes.

Finally, the above elements must be combinable into a system which can cause a continuous run of workpieces to smoothly make the transition from the ambient atmosphere to the vacuum processing chamber with its controlled atmosphere, perform the coating over wide workpieces, such as auto grilles or trim panels, with uniformity over both vertical and horizontal surfaces across the piece, and maintain the rate of progress within the coating section of the chamber at a steady non-varying rate for optimum operation of the coating process.

SUMMARY OF THE INVENTION

Accordingly, it is an object of the invention to provide a sputter coating system for continuously and rapidly coating wide workpieces in a uniform manner across their entire width.

It is a more particular object to provide a sputter-coating system which uniformly coats wide workpieces moving at a steady rate therethrough over both horizontal and vertical surfaces.

It is another object to provide a sputter coating system which utilizes a side by side linear array of sputter sources having a circular outline cathode to cover said wide workpieces, along with a wide capacity vacuum chamber isolation valve and conveyor means to transmit such workpieces steadily and continuously.

It is another particular object to provide an array of sputter coating sources whose source to source spacing and source to workpiece distance are within ranges providing uniform coating for horizontal workpiece surfaces.

It is yet another particular object to provide an array of sputter coating sources with source to source, and source to workpiece, spacing, as well as outboard spacing of outer sources, within ranges providing uniform coating for both horizontal and vertical workpiece surfaces, as well as the edges thereof.

It is a still another particular object of the invention to provide conveying means and isolation valves cooperating therewith for said air locks and processing chamber having the capacity to accept large workpieces with minimal stress for reliability at high repetition rates, and of a compact design to minimize the discontinuity in conveying means caused by the presence of the valve.

It is a still more particular object of the invention to provide an isolation valve whose closure member is relatively thin, and whose closure member support and motive means for the sealing and clearing of the closure member do not interfere with the conveying means, the workpieces thereon, nor the steady progress of the workpieces toward the processing chamber, whether the valve is open or closed.

It is yet a more particular object of the invention to provide an isolation valve with a minimum of moving parts and inertial loads, and improved closure member support and motive means for greater simplicity, reliability and improved sealing capability over a wide area.

The foregoing objects are met by providing a high throughput sputter coating system for coating wide workpieces having a width several times the diameter of an individual sputtering source, and capable of interfacing with input and output conveyer means and air locks. The system includes a vacuum processing chamber having an entrance opening and an exit opening at opposite ends thereof, internal chamber conveyer means for carrying the workpieces and which extend between the entrance and exit opening, first and second isolation valve means sealing entrance and exit openings of the processing chamber, and a first plurality of sputtering sources mounted within the vacuum processing chamber above the internal conveyer means and extending in a side-by-side array transversely to the direction of the internal conveyer means, where the internal conveyer means is of a width no greater than the center-to-center distance between the outermost of the sputtering sources.

Each of the isolation valves includes a wide plate-like gate of width at least that of the internal conveyer means, and sealingly overlappable with the corresponding chamber opening, an elongated member affixed transversely across the gate and extending beyond the edges of gate, and means for supporting the gate at the ends of the elongated member for upward and downward movement and limited inward and outward movement. The valves also include means acting at the ends of the elongated member for applying closure force to gate, means connected to the elongated member for moving the gate up and down along the means supporting the gate. In this manner the system may interface with input and output conveyers and air locks to accept wide workpieces advanced at high throughput rates and passed through the valve means and into the chamber for sputter coating across the full width of the wide workpieces.

Others of the foregoing objects are provided by sputter coating apparatus for uniformly coating both horizontal and vertical surfaces of a workpiece of extended width. The apparatus includes a plurality of sputtering sources aligned in a side-by-side array, each of such sources having a cathode of circular outline, and emitting coating material in a pattern approximating that of a distributed ring source, such sources being spaced from each other a center-to-center distance L, and platen means for supporting and conveying the workpieces beneath the array in a direction of travel orthogonal to the array at a steady rate and at a spacing from the array of a distance H. The platen has a width W, and the spacing L is such that W is less than an even multiple of L. The platen is positioned with respect to the array so that the centers of the outermost sources are located outwardly of the side edges of the platen by a distance A. The center-to-center source spacing L and the workpiece to array distance H is related in accordance with the relationship $$2L/H = S$$

where S ranges from approximately 1.6 to 3.0. Thus both horizontal and vertical surfaces of wide workpieces conveyed by said platen means are evenly coated.

BRIEF DESCRIPTION OF THE DRAWINGS

FIG. 1 is a plan view of a complete metalization system utilizing the work piece transporting and valving arrangement of the present invention, and showing the operation of the conveying portions of such transport arrangement;

FIG. 9 shows a curve illustrating the coating distribution from a single sputtering source used in the invention;

FIG. 10 shows a family of curves illustrating the normalized horizontal surface flux or coating uniformity for various normalized source separations in a three source system;

FIG. 11 shows curves representing the calculated horizontal deposition uniformity for three specific source and deposition plane spacings;

FIG. 12 shows curves representing the experimental confirmation for the calculated curves of FIG. 11;

FIG. 15 shows the three dimensional deposition uniformity with separate curves for horizontal and two vertical components for a multiple-source array having a source spacing of 12" and a source to work height of 14".

FIG. 16 is a figure similar to FIG. 15, except for a source to work height of 10";

FIG. 17 is a figure similar to FIGS. 15 and 16, except for a source to work height of 8".

DETAILED DESCRIPTION

Figure 5:
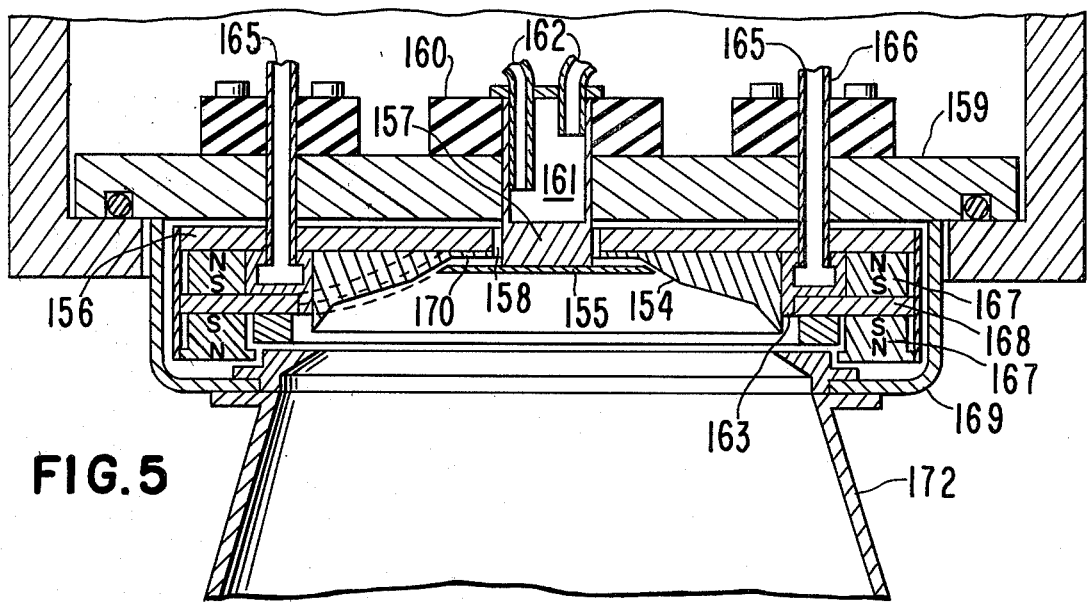
FIG. 5 is a cross-sectional view of a sputtering source used in the vacuum processing chamber of the invention.

The metallization system of FIG. 1 principally includes a transport arrangement 10, a vacuum processing chamber 12, input and output airlock chambers 13 and 14 at the input and output openings of vacuum processing chamber 12, and a plurality of isolation valves 16–19 for the chambers, all arranged in an in-line fashion for serially processing incoming work pieces 21 (FIG. 2) arranged on platens 22 of generally flat and rectangular configuration. The processing chamber includes an entrance transfer section 24, a processing section 25, and an exit transfer section 26, with the platens 22 within the processing section proceeding as steadily and evenly as possible, while in the remaining sections, incoming and outgoing platens are appropriately accelerated or decelerated as necessary to match the progress of platens within the processing section. The processing section may include sputtering apparatus as in the above-mentioned copending application to Rainey, or it may include any of a number of other types of vacuum deposition or sputtering equipment. However, as will be shown, a particularly advantageous wide array of sputtering sources may be utilized due to the wide capacity of the transport arrangement and valves and its steady and high rate of throughput capabilities, providing uniform multiple sputtering source coating over a wide workpiece.

Auxiliary equipment for the system includes two high pump down rate vacuum pumps 28 and 29 respectively for input and output air locks 13 and 14. These pumps provide rapid and repetitive evacuation of the rather large air volumes in the air locks. Two smaller capacity vacuum pumps 31 and 32 are positioned at either ends of vacuum processing chamber 12, and work continuously to maintain a steady predetermined vacuum in the processing chamber. The entire system is powered and controlled centrally by a control and distribution center 33. The center comprises conventional control circuitry of strightforward design and organization, with individual microprocessors controlling major segments of the system, and a master control center 34 by which an operator may control the entire operation of the system. Some of the connections illustrated between center 33 and the operating subsystems are lines 36 and 37 between vacuum processing chamber 12, line 38 to the vacuum pumps and portions of the transport arrangement, and line 39 to the valves and remainder of the transport arrangement.

The transport arrangement 10 includes a number of cooperating conveyor modules arranged in a rectangular path, to enable work pieces to be loaded for processing, and also unloaded after processing, at the same location (load/unload location 41 in FIG. 1). These include a conveyer module arrangement 42 conveying work pieces through air locks 13, 14 and chamber 12, as well as loading and unloading conveyer module arrangements 43 and 44 extending from the air locks to load/unload location 41.

Both loading and unloading arrangements of the transport include first sections 46 and 47, extending orthogonally from the in-line path through air locks 13, 14 and processing chamber 12, and second sections 48 and 49, extending parallel to the original in-line path and ending at load/unload location 41.

Conveyer arrangement 42 for the air locks and chamber include an entrance and exit transfer section conveyer 51 and 52, and a processing section conveyer 53 therebetween. These extend respectively across entrance and exit transfer sections 24 and 26, and processing section 25, of processing chamber 12 between the input and output openings thereof. Similarly, across input and output air locks 13 and 14 extends first and second conveyers 55 and 56 between the input and output openings thereof.

Figure 2:
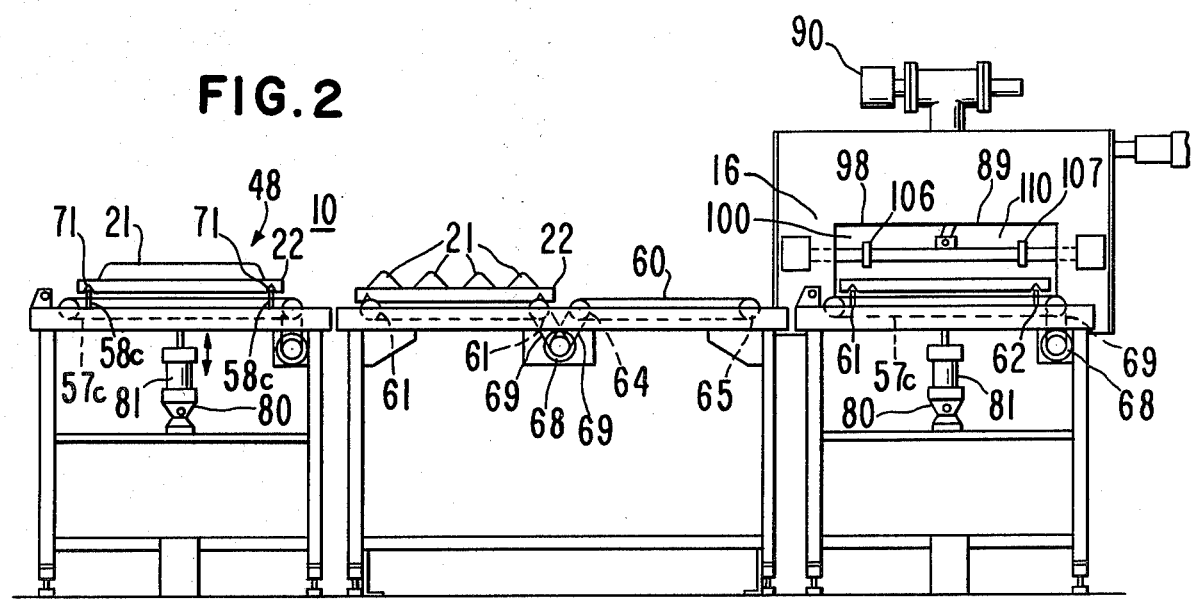
FIG. 2 is an elevational view taken at one end of the system of FIG. 1 indicated by line 2—2, and showing in greater detail the operation of the transport arrangement, including the conveying means and valve arrangement.

The construction of these various conveyer portions of transport arrangement 10 are similar, and may be appreciated by considering FIG. 2 in conjunction with FIG. 1. The main elements of each of the above conveyer portions include one or more pairs of spaced parallel endless belts 59 and 60. The belt pairs 57 in first conveyer sections 46 and 47 of load/unload conveyers 43 and 44 are somewhat more widely spaced apart than the belt pairs 58 of the remaining portions of the transport arrangement. This is because of requirements of interaction of the belt pairs and the platens at the corners of the transport arrangement, as will be explained in detail below.

Each belt of a pair is mounted on two mounting pulleys 61 and 62, the corresponding pulleys of each belt pair being joined by shafts 64 and 65. A drive pulley is mounted on one of the shafts of each belt pair intermediate the ends of the shaft, and a stepper motor 68 connected to such drive pulley with a short drive belt 69.

As in FIG. 2, one stepper motor may be used to drive two adjacent conveyer belt pairs. Stepper motor 68 serves not only to drive the conveyer belt pairs, but also to furnish a feedback signal to control and distribution center 33. Thus, center 33 is able to track the positions of work pieces 21 precisely, for positive interrelationship with the movement of adjacent sections of the transport arrangement. Further, most of the stepper motors powering respective conveyer sections are operable in both a fast and slow mode, depending on requirements for spacing the platens as sensed by control and distribution center 33.

Platens 22 for supporting work pieces transported through the system are furnished on the underside thereof with grooves for positive interaction and engagement with the conveyer belts. The grooves are provided in two orthogonal pairs of parallel grooves 71 and 72, i.e., one groove parallel to each side of the platen is provided, and each groove spaced inwardly of the platen side by the same amount. The spacing between the groove pairs, and the spacing between the parallel belts of the conveyers, is interrelated. Thus, the groove pair 71 along the longer side of the platen is spaced a first distance matching the spacing of the belt pairs 58 in the second section 48 and 49 of load/unload conveyers 43 and 44, as well as the conveyer arrangement 42 within air locks 13, 14 and chamber 12. On the other hand, groove pair 72 along the shorter side of the platens is spaced a second distance larger than such first distance, and matching the spacing of belt pair 57 in the first sections 46 and 47 of load/unload conveyers 43 and 44.

This variation in spacing facilitates the action of conveyer corner modules 75-78, utilized at the intersections of first and second sections 46 and 48, and 47 and 49, as well as at the intersections of first sections 46 and 47 with first and second conveyers 55 and 56. Each corner module involves a first and second paired belt set 57c and 58c, of construction similar to those described above, and respectively aligned with a corresponding one of the two conveyer sections to be joined. For example, for corner module 75 joining first and second sections 46 and 48, belt set 57c aligns with the corresponding belts of first conveyer section 57; similarly belt set 58c aligns with the corresponding belts of second conveyer section 58. The belt sets 57c and 58c are thus orthogonal to each other, and are centered at the same point. Second belt set 58c is of shorter length than first belt set 57c, and thus fits within the first set. Second belt set 58c is mounted on a lift means 80, which includes a cylinder 81 acting vertically to move second belt set 58c up and down relative to the first set 57c on command.

The conveyer sections being joined differ slightly in vertical positioning, with first section 46 and 47 being placed somewhat lower than second section 48 and 49. Thus, a platen 22 arriving at corner module 75 may be moved in the direction orthogonal to its arriving direction, and directed from second section 48 along first section 46 by actuation of lift means 80 to raise second belt set 58c to meet the incoming platen. When the platen is firmly engaged, it may preferably be advanced in a fast mode into a position in alignment with first section 46, whereupon lift means 80 lowers second belt set 58c until the platen is resting on first belt set 57c. The platen is now advanced normally by first belt set 57c, engaging the appropriate groove pair 71, onto first conveyer section 46 of loading conveyer 43. At each intersection, an identical conveyer module repeats this process, thereby moving platens loaded with work pieces around a rectangular path from load/unload location 41 into vacuum processing chamber 12, and then back to location 41.

Upon the arrival of a platen at corner module 76, it must be directed in the aforementioned manner onto first conveyer 55 within input air lock 13. However, at this point, the normally closed external isolation valve 16 at the inlet opening 89 of input air lock 13 must be coordinated with the advancement of the platens. Air lock 13 exists to preserve the controlled atmosphere in processing chamber 12, yet accomplish the transfer of platens, so it is evacuated to match the processing chamber vacuum when in communication with the processing chamber. When accepting a platen, inner isolation valve 17 must be in a closed position, and the air lock vented to the atmosphere by means of vent valve 90. The intervals between successively arriving platens are adjusted by control center 33 so that input air lock 13 is loaded only after having just supplied its previous platen to the vacuum processing chamber 12.

Thus, when an arriving platen upon corner module 76 aligns with first conveyer 55, the platen is lowered onto the corresponding belt set 58c, and that belt set, together with the aligned belts of first conveyer 55, are switched to fast mode, external isolation valve 16 opened, and the platen advanced at a high rate of speed into input air lock 13, and isolation valve 16 again closed. With the newly arrived platen now within input air lock 13, and the external isolation valve 16 closed, the air lock is evacuated rapidly by high-rate vacuum pump 28 down to a preset vacuum to generally match that of vacuum chamber 12. Meanwhile, the preceding platen advances in the slow mode, representative of the speed of the coating process, from the entrance transfer section 24 into processing section 25. As soon as space is again available within entrance transfer section 24, second isolation valve 17 opens, and first conveyor 55 and entrance transfer section conveyer 51 are activated in the fast mode, to propel the succeeding platen into entrance transfer section 24, whereupon second valve 17 is closed, the conveyer speed is reduced to the slow mode, and the platen proceeds at the slow rate into processing section 25 and exit transfer section 26. Meanwhile, input air lock 13 is again vented, accepts a subsequent platen, is evacuated and made ready to complete a platen transfer into the vacuum chamber.

At the output side of the vacuum chamber, the operation is similar to the above, but in reverse order. When a platen has fully emerged from processing section 25 into exit transfer section 26, output airlock 14 has been fully evacuated by pump 29, third isolation valve 18 opens, and the platen is rapidly moved out of the vacuum chamber, with exit transfer section and second conveyers 52 and 56 operating in fast mode, into output air lock 14, whereupon valve 18 is closed. Output air lock 14 is then vented by vent valve 91, external isolation valve 19 is opened, and the platen is advanced at a high rate of speed onto corner conveyor module 77. Then external valve 19 is closed in preparation for output airlock 14 communicating with the vacuum chamber and receiving a succeeding platen.

The exiting platens arrive upon corner conveyer module 77, and are directed in an orthogonal direction along first section of unloading conveyer 47, and then redirected by corner module 78 along the second section 49 thereof back to load/unload location 41, where the coated work pieces are offloaded. Thus the actuation of the valve, and movements of the platens and conveyers, along with the corner modules, are coordinated to maintain a continuous even flow of workpieces through the processing section 25 of chamber 12 at the optimal speed for the coating process.

Figure 3:
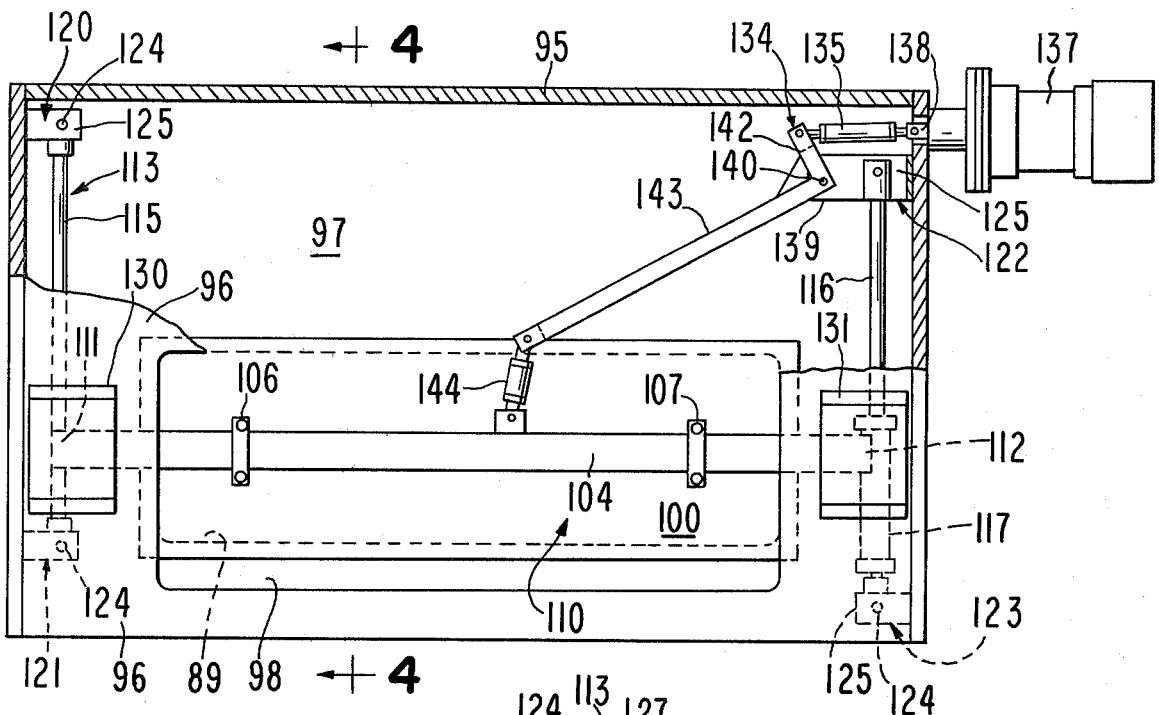
FIG. 3 is a more detailed elevational view partially broken away of the isolation valve of the invention.
Figure 4:
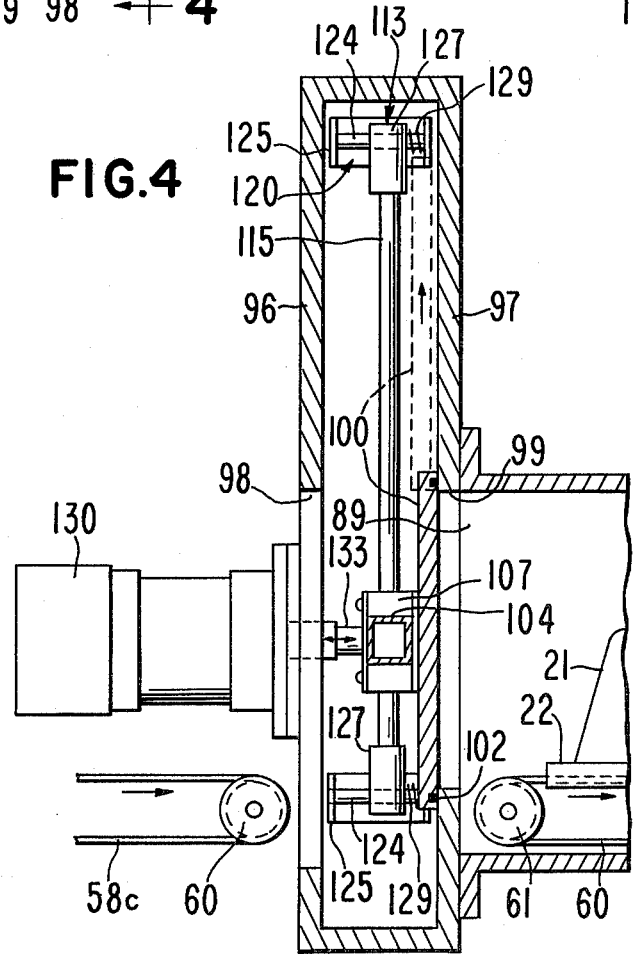
FIG. 4 is a side elevational view of the valve of FIG. 3, showing its operation in more detail and its cooperation with a vacuum chamber and the conveying means.

Each of the isolation valves 16 through 19 is of similar construction; FIGS. 2, 3 and 4 show illustrative valve 16 and its operation in detail. Valve 16 controls access to the inlet 89 to input air lock 13, and includes a rigid support frame 95 of narrow box-like construction secured to air lock 13. Frame 95 includes front and rear parallel plates 96 and 97, which are apertured generally to match inlet 89, with front aperture 98 extending lower than rear aperture 99 so that the close placement of the end of conveyor 46 (more particular corner module belt pair 58c) to rear aperture 99 is not inhibited. All such apertures and inlets are of generally rectangular configuration, elongated in the horizontal direction transverse to the direction of the adjacent conveyer means, in order to provide for acceptance of wide work pieces and platens. The closure member which actually seals rear aperture 99 in chamber inlet 89 is a flat plate-like gate member 100, of similar configuration to chamber inlet 89 and aperture 99, but of somewhat larger area so as to overlap these. The face of gate member 100 toward the chamber opening is grooved just inwardly of its periphery and retains therewithin a sealing ring 102 of elastomeric material for insuring an air tight seal. On the opposite side of gate 100, an elongated reinforcing member 104, in the form of a hollow beam of box cross-section, is secured thereacross, midway of the upper and lower edges of the gate, by two clamp assemblies 106 and 107. Clamp assemblies 106 and 107 are laterally positioned at points between the midpoint of gate 100 and its side edges, generally about one-quarter to one-third of such distance inwardly of the edges, depending on the proportions of width of the gate to its height. These clamping positions are chosen especially for optimal distribution of sealing forces about the gate in as even a manner as possible. Elongated beam 104 protrudes outwardly from the side edges of gate 100, and the gate assembly 110, comprising member 100 beam 104, and clamps 106 and 107, is entirely supported from these protruding ends by gate support means 113, as will now be explained.

Gate support means 113 includes upright vertically extending elongated shafts 115 and 116 provided at the sides of frame 95, outside of chamber opening 89 and conveyor belts 58c, and thus, outside the path of a platen 22. The ends 111 and 112 of transverse elongated member 104 extend to the shafts 115 and 116 and respectively engage the shafts on slide mountings. The mounting of left end 111 is fork shaped and embraces the shaft about approximately half the shaft circumference, while right end 112 is secured to clamp cylinder assembly 117, which slidably engages shaft 116 upon slide bearings mounted at its extremities.

Clamp cylinder 117 is elongated downwardly from beam 104 along shaft 116 to counter and distribute any torquing forces tending to cause binding of the sliding action. As will be seen below, such forces might tend to be exerted during the lifting of the gate assembly 110. Thus, guided by clamp cylinder 117 and the half-circular mounting on left end 111, gate assembly 110 is supported orthogonally to vertical shafts 115 and 116, and is slidable up and down on the shafts. In case of need to dismount for maintenance, the no more than 180 degree engagement of left end 111 with shaft 115 facilitates removal of gate assembly 110.

Shafts 115 and 116 are in turn supported within frame 95 at their extremities by slide mounts 120-123 of similar construction. Each such mount includes a short shaft pin 124 secured at its ends to a U-shaped retainer bracket 125 mounted to frame 95. Each such pin extends horizontally in the axial direction, parallel to the path of conveyer arrangement 42 through the air locks and chamber. The extremities of each shaft 115 and 116 are held within guide block 127. The juncture of shaft and block is not completely rigid, but rather allows a degree of flex and axial expansion, to preclude binding. Block 127 in turn slidably mounts on pin 124 by means of a cylindrical opening in the block, the opening being lined with a bearing material permitting a few degrees of flexing, to preclude binding. Lower right side shaft mount 123 is displaced somewhat lower than the corresponding element on the left, in order to allow clearance for the extended lower end of cylinder 117, as discussed above. The position of slide mount 123 is set so that when cylinder 117 bottoms against it, gate assembly 110 is properly in registration with opening 89 for subsequent sealing thereof.

Captured between shaft guide blocks 127 and the inner end of bracket 125 are springs 129, for maintaining an outward bias on shafts 115 and 116 at each of the ends thereof. Thus in the absence of an opposing force, gate assembly 110 is biased outwardly from opening 89, alleviating the tendency to scuff seal ring 102 unnecessarily. FIG. 4 illustrates how such outward movement of the gate assembly is accomplished by the above means. Thus, the vertical support shafts 115 and 116, together with slide mounts 120-123, support gate assembly 110 not only for vertical movement, but also for movement axially transverse thereto. The dotted-line position of gate 100 in FIG. 4 is representative of the position of the gate after it has been moved outwardly and then upwardly to the fully opened position.

Closure force is provided by a pair of air cylinders 130 and 131, each secured respectively upon either side of front plate 96 of frame 95, in alignment with ends 111 and 112 of beam 104 when gate 100 is in its bottomed position. Each cylinder has a portion 133 which protrudes through an aperture in front plate 96 (FIG. 4), and which is driven directly against a respective one of ends 111 and 112, thereby driving gate 100 inwardly and sealing the chamber opening. The force which is in this manner evenly applied to the respective ends, is evenly distributed over the gate because of the placement of the beam and clamps as described above. It should be noted that once the chamber has been sealed, and fully evacuated, atmospheric pressure suffices to maintain the seal of gate 100. The design of the valve permits major dismounting of all portions of the isolation valve in case need arises for maintenance, while still allowing gate member 100 to remain in place. This is especially important with regard to the isolation valves controlling the interface between input and output air locks and processing chamber 12, since avoiding the need to disturb the controlled atmosphere therein also consequently avoids the prolonged period of evacuation which would be necessary to restore the controlled atmosphere.

The valve also includes a gate lift or clearance means 134 which applies an upwardly and downwardly acting force to beam 104, resulting in vertical movement of gate assembly 110 up and down shafts 115 and 116. The only connection between this means and gate assembly 110 is by means of a deformable or flexible rod and sleeve 144 joining beam 104 at a point near the midpoint of the beam. Thus, gate lift means 134, and gate support means 113, are quite distinct. The lift means operates only after air pressure on either side of the valve has been equalized, so that little or no closure force exists on gate 100. In the case of external isolation valves 16 and 19, respectively at the inlet to air lock 13 and the output of air lock 14, the air lock is vented to atmospheric pressure before the gate lift means 134 is operated. In the case of interior isolation valves 17 and 18, these are not opened, nor the lift means operated, until the air lock is evacuated to match the processing chamber atmosphere.

The gate lift means includes an actuator air cylinder 137 mounted on the outside of frame 95, in between front and rear frame plates 96 and 97, in the outside right hand corner, above and to one side of gate assembly 110 and upper slide mount 122 of shaft 116. Actuator 137 is mounted transversely to the path of the conveyers and work pieces through the valve, with a piston 138 extending through an aperture in frame 95 into the inside of the frame, just above shaft mount 122, which includes an inwardly extending portion 139. At the end of such portion 139, a pivot point 140 is provided for the junction of two orthogonally joined lever arms 142 and 143. Arm 142 is relatively short and extends upwardly to join one end of flexible rod and sleeve connector 135, whose other end is joined to piston 138. The other lever 143 is several times the length of lever arm 142, and extends downwardly to join flexible rod and sleeve connector 144, whose other end, as above mentioned, joins beam 104. In the closed position of gate 100, or with the gate bottomed, piston 138 is fully extended, and lever 142 extends upwardly to the left, making an acute angle with the vertical. Similarly, lever 143 extends downwardly, making an acute angle with the horizontal. With the equalization of pressure on both sides of the valve prior to an opening cycle, springs 129 act to push gate 100 outwardly a limited distance, approximately in alignment with the dotted line position shown in FIG. 4. The deformable joint comprising the rod and sleeve connectors 135 and 144 in the linkage joining cylinder 137 and beam 104, have enough flexibility to accommodate this small outward movement of gate 100. At this point, cylinder 137 is actuated to force piston 138 inwardly into the cylinder, and thereby cause a resultant upward force on gate assembly 110 to lift it to the dotted line position of FIG. 4. It is then completely removed from the path of work pieces moving through the valve. Also, during the entire operation, the lift means 134, including cylinder and linkage, operates in a plane generally parallel to and just ahead of gate 100, while the gate moves only in a plane closely adjacent and parallel to its closure position. After the passage of the platen 22 through the gate, the closure position of the valve cycle commences with the reversing of the foregoing operation. Cylinder 137 is now actuated to extend piston 138, thus controllably lowering gate assembly 110 to its bottomed position, which then enables the closure means to operate to seal the valve.

Such transverse gate clearance motion, in a direction generally across the plane of the closed position of the gate, and the confinement of all the elements of the gate lift clearance means 134 to positions well away from the path of the workpieces, and in planes closely adjacent the closed position of the gate member, mean that the present isolation valve together with its opening and closing operations has the smallest possible effect on the continuous advancement of workpieces into the system. Even in the closed position, platen 22 may continue to be advanced into close proximity with the gate member 100, insuring maximum throughput, since even in the closed position, no portion of the valve, whether of gate assembly support 113, closure means 130 and 131, or lift means 134, protrudes more than minimally into the space ahead of the gate member traversed by the workpieces and conveyer. Furthermore, the conveyer means on either side of the valve may be located in close proximity to the closure members, without risking interference with any portion of the valve elements. Thus the discontinuity in conveying means which is seen by the platens as they traverse the valves is kept to a bare minimum, for an unusually compact design and volume having minimal impact on evacuation time, especially considering the large aperture requirements of the wide workpieces.

Returning to a consideration of the vacuum processing chamber 12 in more detail, it will be seen (FIG. 1) that the chamber includes six side-by-side arrays 150 of sputtering sources 152 in modules of three arrays each, with each of the arrays and the line of travel of conveyer arrangement 42 and processing section conveyer 53 being orthogonal to each other. One or more of these arrays are held in reserve, in order to provide spare sources for a backup capability should a corresponding source of an operating array require service. The processing chamber can continue to operate with as little as one complete array in operation; as will be seen, each array is arranged to provide uniform coating across a workpiece passing under it. However, the throughput rate will be slower, and the speed of the conveyer adjusted downward accordingly by central processor 33. As normally operated, several on up to five arrays are operated in parallel, for maximum production rates.

The sputtering source 152 (FIG. 5) for the source arrays is one with a circular-outline, generally concave cathode 154, and a central anode 155 smaller than the cathode. The source emits material generally in a pattern approximating that of a distributed ring source, and more particularly in the pattern illustrated in FIG. 9. Such a source is sold commercially by Varian Associates as the "S-gun"—TM. The diameter of the source is approximately 4.8 inches, but it will be appreciated that variations can be made in this and other characteristics of the source without detracting from its usefulness in an array 150 of processing chamber 12.

The particular construction of the source in the present embodiment of the invention illustrated in FIG. 5 may be found described in more detail in, for example, the copending U.S. application Ser. No. 805,485, filed June 10, 1977, to R. M. Rainey, entitled "Target Profile for Sputtering Apparatus", now issued as U.S. Pat. No. 4,100,055. Generally the relatively small flat circular anode 155 is disposed centrally within the open-ended surrounding cathode structure 154 of circular concave form. Mechanical alignment is maintained by mounting cathode 156 to inner magnetic pole piece 154 and mounting anode 155 on anode post 157, preferably of copper, electrically isolated from inner pole piece 156 and separated from cathode 154 by annular space 158 and mounted on base plate 159 by flange 160. Anode post 157 has internal cooling cavity 161 through which a coolant circulates by means of conduits 162. Cathode cooling is provided by member 163, which has an internal channel through which a coolant is circulated via conduits 165 electrically isolated from base plate 159 by insulator 166. Magnets 167 having the indicated rows of polarities provide a magnetic field which has the generally indicated fringing field direction at a point central to the anode and cathode electrodes and similar field direction in proximity to the cathode surface. The main magnetic field is maintained between inner pole piece 156 and outer pole piece 168. The strength of the magnetic field is sufficient to prevent secondary electrons from the cathode from reaching the workpiece passing below. A ground shield 169 defines the electric field and the plasma density. A retaining ring 170 also isolated from anode post 157 by insulating space 158 is used to secure cathode 154 to inner magnetic pole piece 156.

As usually operated, the anode is maintained at ground potential and the cathode may be held at potentials ranging from −350 volts to −1000 volts, depending upon the cathode material. An annular emissions shield 172 extends outwardly from the periphery of the opening of the ground shield 169 and at an acute angle to the vertical for a distance of several inches. The function of the shield 172 is to limit sputtered emissions from the source (considered as emanating from the center of the cathode) to an angle of no more than approximately 45° to the vertical. This is because experience has taught that emissions at very large angles to the vertical tend to produce poor quality coatings and are unpredictable in impact.

Figure 6:
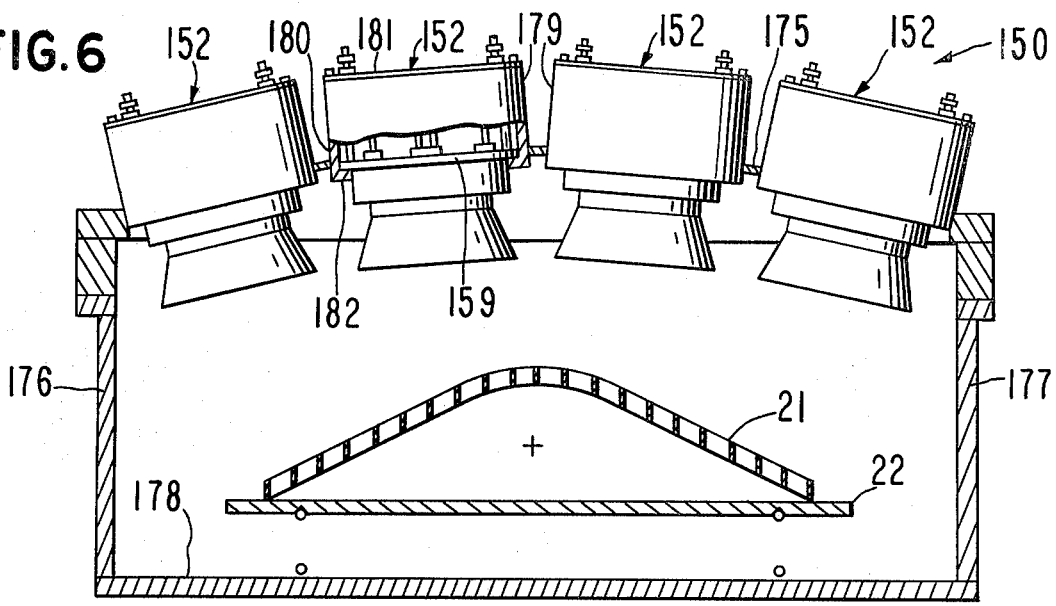
FIG. 6 is a front elevational view partially in cross-section taken along line 6—6 of FIG. 1 of the vacuum processing chamber of the invention, showing an arcuate side-by-side array of sputtering sources.
Figure 7:
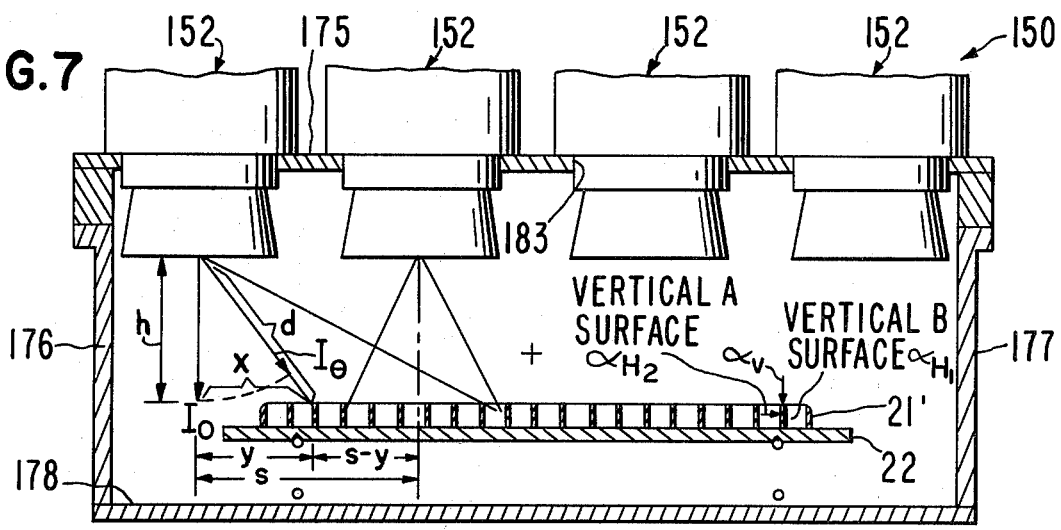
FIG. 7 is a front elevational view partially in cross-section taken along line 6—6 of FIG. 1 of the vacuum processing chamber showing an alternative array of sources in a side-by-side straight line array.
Figure 8:
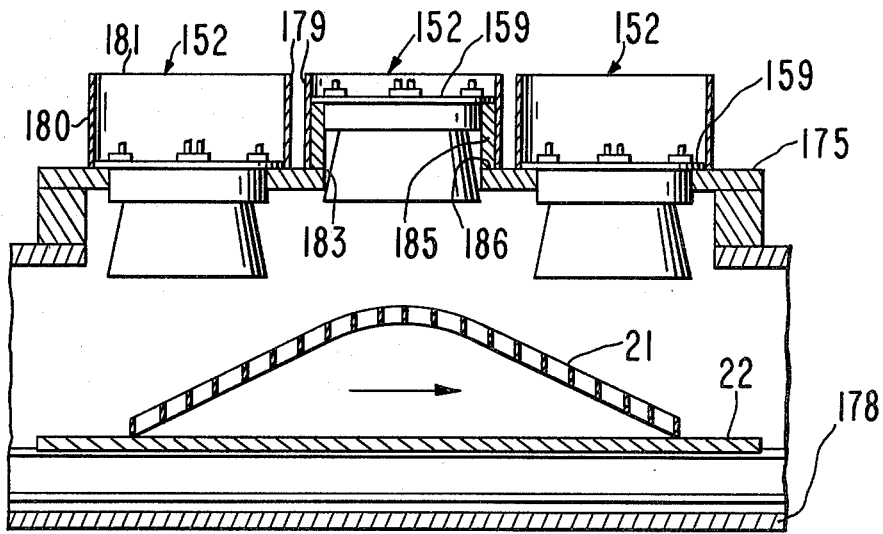
FIG. 8 is a side elevational view partially in cross-section of a vacuum processing chamber such as in FIG. 7, showing the manner in which an individual source may be raised with respect to other remaining sources of the chamber.

FIGS. 6 to 8 illustrate by means of a section through processing chamber 12 the manner in which arrays 150 of sources 152 are utilized in the invention. Each source is removably mounted to the top wall 175 of the chamber (which also includes sides 176 and 177 and floor 178) by means of a housing 179. Housing 179 includes a cylindrical portion 180 and a top plate 181 by which internal access to the source may be had. Cylindrical portion 180 may include a reentrant base portion comprising flange 182 (FIGS. 5 and 6) upon which source base plate 159 rests, or it may be a simple cylinder as in FIGS. 7 and 8, resting on top wall 175, with the source 152 being also supported upon the edge of circular opening 183 in top wall 175 by base plate 159. It will be noted that such construction permits easy disassembly and removal of the entire assembly of sources, or of any individual source. Further, at least in the construction exemplified in FIGS. 7 and 8, the vertical position of an individual source may be altered by the addition of annular spacer sections 185 (FIG. 8) within cylindrical housing portion 180, between base plate 159 and a corresponding annular portion 186 of chamber top wall 175.

The spacer section technique is used when workpieces are to be coated which have a sufficiently marked variation in height that an array of sources working in a straight line cannot reach all surfaces with a sufficiently even coating. Although FIG. 8 shows how a source of one array may be raised with respect to that of the remaining arrays, and provide improved coverage of workpieces varying in height along the direction of travel, more typically the spacer technique is used to deal with variations in workpiece height transverse to the direction of travel of platen. Alternatively, when it is known beforehand that the system will be coating only workpieces whose transverse cross section includes a predetermined height contour, such contour may be built into the top wall, as shown in FIG. 6. More typically, however, it is found that many workpieces or substrates to be coated will not have such marked height variations as those illustrated. In such more usual situations, any non-planar quality of the workpiece is handled by an appropriate geometrical configuration utilizing the straight-line array of FIG. 7; moreover, the sources may be individually controlled and monitored for maximum uniformity control.

The more serious problem in connection with the coating of workpieces has been the problem of generally planar substrates (or curved in a manner compensable as above) which also include irregularities of considerable depth, such as in the workpiece 21' illustrated in FIG. 7. Although generally flat, the workpiece 21' includes a grill work of the "egg crate" variety having vertical surfaces A facing one side of the chamber, vertical surfaces B facing forwardly in the chamber, as well as horizontal surfaces at the top of the workpiece, all of which must be coated with uniformity for a satisfactory product. In other words, over the width of the work, the horizontal coating should not vary in thickness by more than a small predetermined amount. Similarly, the coating thickness on the vertical A and B surfaces, while different than the horizontal, should also not vary by more than another small predetermined amount.

Since the system must be capable of handling larger width workpieces, (of width several times the diameter of any one of the available sources), an array including a plurality of sources must be utilized. Obviously, the spatial relationship of the sources to each other within such an array, and of the sources to the work, will have a large effect on the degree of uniformity of the coatings on workpieces being moved at a steady rate under the sources. A pivotal problem solved in the invention is to determine and define these relationships for optimal uniformity of coating. It will be shown that a practical set of optimum relationships can indeed be determined for which the system will provide substantially uniform coating coverage over workpieces moving at a steady rate below the source.

This determination proceeds from the known fact that the deposition distribution for a single source 152 is as shown in FIG. 9 as the solid curve; the dotted line is the distribution as it would be if source 152 operated as a true distributed ring source. It will be seen that the actual curve is in fact generally a fair approximation of the theoretical ring source distribution. Plotted is the relative flux density (normalized to that directly below the center of the source as a function of radial offset distance y from the center of the source, normalized to the height of the source above the plane of deposition.

The distribution curve of FIG. 9 is generated by using measured data which treats the distribution as emanating from a point souce. Referring to FIG. 7, h is the distance from a source 152 to the horizontal plane of deposition, and the radius of a hemisphere centered at the source, $I_\theta$ is the flux density on the center line immediately beneath the source; $I_\theta$ is flux density at the point at which the flux is measured on the hemisphere at an angle $\theta$ with the vertical; x is the radial offset from the source to the point at which the flux is measured in the plane of deposition at angle $\theta$ with the vertical, and d is the distance between the flux measuring point on the plane and the source. To obtain the approximate flux distribution onto the horizontal plane of deposition, the inverse square law may be used. Thus, the flux density $I_p$ at the deposition plane is given by $$I_p = I_\theta x(h/d)^2 \quad (1)$$

Normalizing with respect to $I_\theta$ we have $\alpha_p$ the normalized flux or deposition thickness:

$$\alpha_p = (I_\theta/I_\theta) \cos^2\theta \quad (2)$$

Also since $x/h = \tan\theta$ we can conveniently express the distribution as a function of this ratio. In fact, we use a factor y, which is set equal to $2x/h$ for convenience, in plots of flux distributions, for example, FIGS. 9 and 10. In this manner, the diameter $2x$ of the distribution in the deposition plane is related to h, and the factor y may be thought of as the radial offset or horizontal position normalized to the height h.

Figure 13:
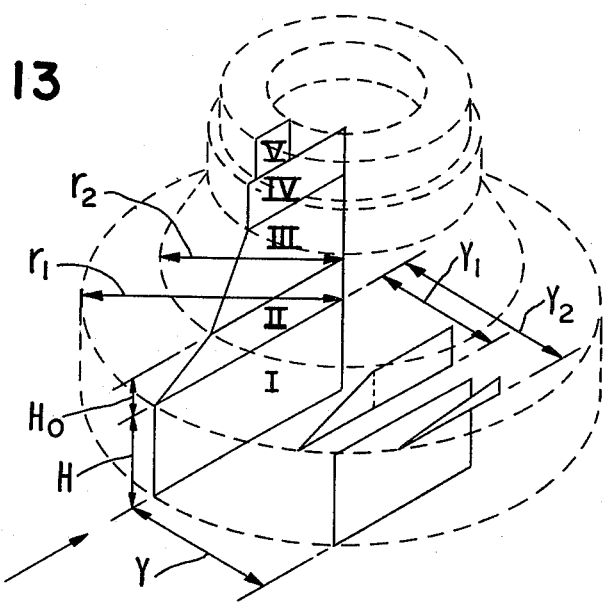
FIG. 13 represents the distribution of flux deposition in three dimensions from a single source, approximated geometrically to aid calculations.

It has been found that expressions for the integrated collection of material due to the passage of a workpiece or plane of deposition under one or more sources of the array may be approximated by the following technique. As indicated in FIG. 9, the area under the curve can be approximated by the various figures I through V. In three dimensions, the figure of rotation generated by the curve of FIG. 9, which is the three dimensional deposition profile of the source, may similarly be approximated as indicated in FIG. 13. An empirical relationship is derived with the aid of the approximated distribution as in FIG. 13, which accurately and quickly makes apparent the proper source array and work piece spatial relationships for best horizontal surface coverage. Further determinations then elaborate this analysis for determination of the best locations within these spatial relationships for even coverage of vertical surfaces as well, and for avoidance of edge affects, as will be detailed below.

This practical approach involves obtaining an expression of the relative flux or deposition thickness along various lines of travel in the direction of movement of the workpieces, from a given source. Using this expression, contributions from other sources offset from the original source to the relative flux along these various lines are added together. The values thereby obtained for relative flux on different lines of travel under several sources are then plotted for various values of normalized source separations. These curves can then be used to isolate specific values for source-to-source separations and source-to-deposition plane distances which would be most useful in obtaining a uniform deposition across the work of interest.

The area under the distribution of FIG. 13 is integrated for a linear pass through the distribution along a line of travel parallel to the direction of travel indicated, at an offset y from the center of the first source. To facilitate determining the integrated collection of material along such a line of travel, the distribution is conceived of as approximated by a stack of cylindrical and conic sections I through V. It is then necessary only to derive the solutions for these cylindrical and conic sections to perform the desired integration.

The cross sections illustrated in FIG. 13 aid in deriving these cylindrical and conic sections solutions. The areas I through IV illustrated show the cross section defined through the distribution for a linear pass which lies on a diameter of the distribution. For linear passes removed from such a diameter, these areas change; see the smaller cross sections through cylindrical section I at offset distance y, and the cross sections defined in conic sections II at offsets $y_1$ and $y_2$.

Accordingly, for cylindrical sections such as I, IV and V (V is actually an annulus, but treatable as the difference of two cylinders), the flux contributions $I_{cyl}$ at a line offset a distance y from the cylinder is given from geometry by:

$$I_{cyl} = H\sqrt{r^2 - y^2} \quad (3)$$

where h is the height of the cylindrical section, and r is the radius of such section in the distribution of FIGS. 9 and 13.

For a conic section such as II and III, two expressions are needed because of the changes in configuration of the cross section as shown in connection with conic section II in FIG. 13. The conic section exhibits an inner radius $r_2$ and an outer radius $r_1$, while its height may be denoted by $H_o$. Then for a linear pass offset a distance $y_1$, between 0 and $r_2$, the flux contribution $I_{conic}$ from the conic section is, from geometry, $$I_{conic} = \frac{H_o}{2}\left(\sqrt{r_1^2 - y_1^2} + \sqrt{r_2^2 - y_1^2}\right) \quad (4)$$

On the other hand, for a linear pass offset a distance $y_2$, which denotes values of y between $r_1$ and $r_2$, the same flux contribution becomes $$I_{conic} = \frac{H_o}{2}\left(\sqrt{r_1^2 - y_2^2} \cdot \frac{r_1 - y_2}{r_1 - r_2}\right) \quad (5)$$

By the use of the foregoing equations 3 through 5, the contributions of each conic and cylindrical section I through V may be obtained with a numerical integration, since the height and radius of each such section I through V is known from the original distribution plot of FIG. 9.

Specifically, we can determine from FIG. 9 that:
for cylinder I, R=2.0, H=0.34.
For conic section II, R=2.0, R=1.4, H=0.16
For conic section III, R=1.4, R=1.0, H=0.34
For cylinder IV, R=1.0, H=0.18
For hollow cylinder V, the inner radius=0.64 and the outer radius=0.94; H=0.15

Then for a linear pass through the distribution at a given offset y, the total integrated collection of material $I_{Total}$ due to one source is the sum of the contributions from sections I through V, with the above values substituted in the foregoing expressions so that the flux $I_{Total}$ is obtained as a function of Y.

Now contributions to the integrated collection of material along a linear pass at offset y from still other sources in the side-by-side array may be considered. A second source at a normalized distance S to one side of the first source, orthogonally to the direction of travel of the work piece to be coated, will be considered, where S=2 L/h, and L is the actual center-to-center distance between the two adjacent sources. The deposition plane to source height is again h. It will be noted that the normalized source separation S is also in "y" units, i.e. is a dimensionless quantity normalized to h, as in the case of y.

Figure 14:
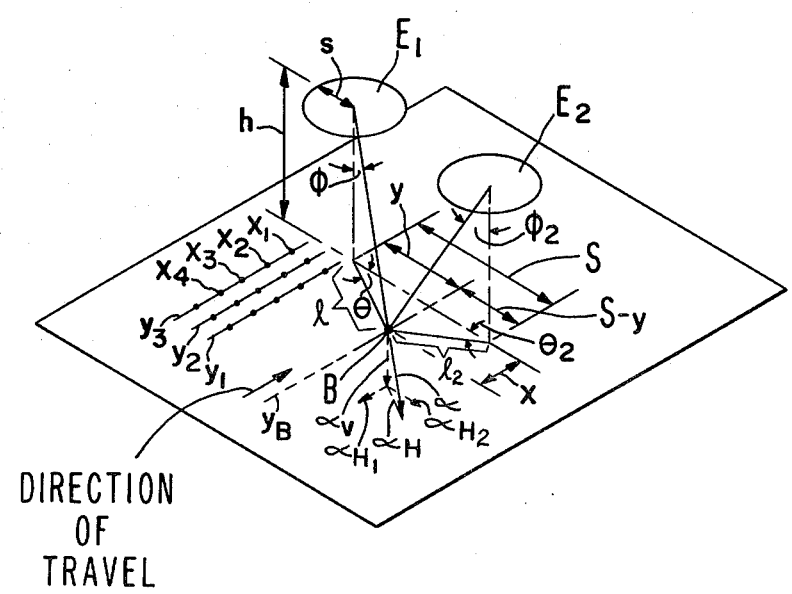
FIG. 14 is a simplified schematic representation of two side-by-side sources and shows the geometry useful in calculating flux components deposited from one or both sources.

Accordingly, if as in FIG. 14 a generalized line of travel $y_B$ passing through a point B on the deposition plane between two adjacent sources separated by a distance S is imagined, where line $y_B$ is offset from the first source a distance y, that line of travel relative to the second source will be offset a distance (S−y). Thus, for contributions $I_{Total}$ to the flux or coating thickness along line $y_B$ due to the second source, we may use the same expressions above derived for $I_{Total}$ as a function of y, f(y), except that for y, the quantity (S−y) is utilized instead. Thus, the combined integrated flux contribution $I_{Total\ 1,2}$ for a linear pass along line $y_B$ is:

$$I_{Total\ 1,2} = I_{Total\ 1}f(y) + I_{Total\ 2}f(S-y) \tag{6}$$

Similarly for a third source laterally offset a distance S from the second source:

$$I_{Total\ 1,2,3} = I_{Total\ 1}f(y) + I_{Total\ 2}f(S-y) + I_{Total\ 3}f(2S-y) \tag{7}$$

It will be seen from the above that curves may be generated which plot, for each of various values of source separation S, the normalized flux or accumulated material along lines of travel at various values of offset from the first source. We know that a single sputtering source is limited to use within certain maximum lateral and height distance constraints, in order that acceptable coating deposition quality be maintained. Accordingly, S values will have a practical upper limit of approximately 3.5. Similarly, the same type of constraint limits the upper range of expected useful values of y to a similar figure. Accordingly, for the line of travel at each value of y in increments of 0.1 from 0 to 3.6, the value of the combined total contribution from all three sources $I_{Total\ 1,2,3}$ is calculated, first assuming a normalized source separation S of 1.0. The operation is then repeated for larger values of S in increments of 0.2 on up to S=3.4. The results are tabulated in Table A of the appendix, and plotted in FIG. 10.

From the calculations, it is apparent that values of S much lower than 1.6 have a high degree of non-uniformity of flux as y varies, and hence, have not been shown in the figure. The values of S of interest will then be 1.6 to approximately 3.0, as is apparent from FIG. 10. Further, the figure reveals that the most even depositions across useful ranges of y occur for values of S between about 1.7 to 2.4. It has also been found that these conclusions hold generally for arrays with more than two sources (for example, 4 or 5), the three-source array being adapted for the above analysis merely for ease of computation.

The generalized deposition curves of FIG. 10, and the data of Table A, are useful in identifying those specific geometries for source-to-source and work piece to source spacings which will result in the most uniform deposition of coating material on the work piece horizontal surfaces. Of course, it is assumed that the work piece or deposition plane will be no longer than the center-to-center separation between the outside two sources. Thus, in a three-source side-by-side array, the work piece will be no more than 3 L in width. It will be recalled that since y=2x/h, the tabulated values for y are directly convertible to actual horizontal offset values x, once h is chosen. Accordingly, various values of h are substituted, beginning from the aforementioned maximum of 14 or 15 inches. The actual offset values of x are immediately obtainable, as set out above. Then if it is supposed that a uniformity response criterion comparable to the generalized S=2.4 curve is desired, the value L for the actual source-to-source separation in the array is also fixed. Using the values x obtained as aforementioned, a plot of the actual calculated response is then obtained, for comparison with other geometries.

For example, if an intermediate value of 10″ for h is chosen, and a uniformity response comparable to that for the generalized curve S=2.4 is desired, then L is 12″; y=1 is equal to h=5″, and similarly for the remaining y values. Thus, just as y ranges from 0 to 3.4, so also x ranges from 0 to 15″. Curve B in FIG. 11 is representative of the deposition uniformity for this geometry. In similar fashion, other values of h over its range are examined; see the remaining curves of FIG. 11, where source separation L is maintained at L=12″, while h=8″ (S=3.0) is shown in curve A; curve C shows the situation where h=14 (S=1.7). Thus, from FIG. 11, we see that for a 12″ source separation a range of source to deposition surface distances exist, i.e. values of h from about 10 through 14 inches, where better than plus or minus 10% horizontal deposition uniformities may be obtained; while for values of h smaller than these, uniformity deteriorates and becomes unacceptable.

The geometries as designed above through calculation have also been measured, and the actual measured relationships have been plotted in FIG. 12 for h=8 (curve A), h=10 (curve B), and h=14 (curve C), for comparison with the corresponding calculated values of FIG. 11. It is seen that substantial correspondence exists, and that the calculated FIG. 11 along with the above technique predicts the geometries which yield uniform deposition quite well. Note that the above analysis assumes a sputtering source, such as source 152 with approximately the response as set forth in FIG. 9, and with approximately the same diameter of 4.5 to 5.0 inches or more generally, approximately of the order of ⅛ L to ½ L (a typical value of L being 12 inches). The actual diameter of the source 152 of FIG. 9 is 4.8″.

If practical workpieces are smooth and include only horizontal surfaces to be coated, the foregoing analysis suffices quite well in setting forth the correct geometries for uniformity of deposition. However, many practical work pieces will also have vertical surfaces as well as horizontal surfaces to be coated. Thus, the foregoing only roughly specifies the proper geometry which must be further refined to take into account the need to also uniformly coat the vertical surfaces, as well as the proper geometry to compensate the fall off in vertical surface deposition near the edge of the work piece, the "edge effect" which will be further discussed below.

For this portion of the problem, use is made of a known relationship for the flux at a point, for example, point B in FIG. 14, on a deposition plane below and parallel to the plane of a single sputtering source emitting coating material with the characteristics of a distributed ring source:

$$\alpha = \frac{\left\{1 + \left(\frac{l}{h}\right)^2 + \left(\frac{s}{h}\right)^2\right\}\left\{1 + \left(\frac{s}{h}\right)^2\right\}^2}{\left\{\left[1 - \left(\frac{l}{h}\right)^2 + \left(\frac{s}{h}\right)^2\right]^2 + 4\left(\frac{l}{h^2}\right)\right\}^{3/2}} \tag{8}$$

where $\alpha$ is the normalized flux at point B on the deposition plane below the source which is a radial offset distance l from the center of the source, and h is the height above the deposition plane of the source, the normalization being with respect to the flux at a point directly beneath the center of the source, and s is the radius of the "ring" source.

Although the foregoing allows the total normalized flux at any point on a deposition plane to be determined, it is also useful to have both the vertically directed component $\alpha_V$, and the horizontally directed component $\alpha_H$. For a plane of deposition moving past the source linearly at a steady rate, and under the assumption that the flux appears to emanate from the center of the source as a single ray, the vertical component can be written (see FIG. 14) as:

$$\alpha_V = \alpha \cos \phi \quad (9)$$

and the horizontal component may be written as:

$$\alpha_H = \alpha \sin \phi \quad (10)$$

where $\phi$ is the angle which the direction of the flux arriving at B makes with the vertical.

The vertical component $\alpha_V$ is, of course, responsible for deposition of coating on horizontal surfaces of the workpiece (see FIG. 7), but the horizontal component $\alpha_H$ needs further analysis. The latter component can be split into a component $\alpha_{H1}$ directly opposing the direction of travel of the workpiece, or deposition plane, and a component $\alpha_{H2}$ perpendicular to the direction of travel. With reference to FIG. 7, it will be seen that the workpiece has vertical surfaces facing in two different orthogonal directions, one set which we term vertical B facing forward in the direction of the travel, and another set termed vertical A perpendicular to the line of travel and facing sidewardly. The two horizontal components $\alpha_{H1}$ and $\alpha_{H2}$ are respectively responsible for the deposition of coating upon the forward facing vertical surfaces B, and upon the side facing vertical surfaces A, as indicated. Note that the rearwardly facing vertical surfaces are covered by a negative $\alpha_{H1}$ component as those surfaces move away from the source, while the right side facing vertical surfaces are coated from another adjacent source to the right operating to furnish an $\alpha_{H2}$ component. The horizontal flux components are usefully expressed as:

$$\alpha_{H1} = \alpha_H \sin \theta \quad (11)$$

$$\alpha_{H2} = \alpha_H \cos \theta \quad (12)$$

where $\theta$ is the angle which the projection $l$ of the flux on the horizontal plane of deposition makes with the horizontal direction (along y) orthogonal to the line of travel (see FIG. 14). Substituting for $\alpha_H$ we then have $$\alpha_{H1} = \alpha \sin \phi \sin \theta \quad (13)$$

$$\alpha_{H2} = \alpha \sin \phi \cos \theta \quad (14)$$

Calculations are aided by rendering the above equations in terms of x and y, h and l. This may be done by noting that from geometry:

$$l^2 = x^2 + y^2 \quad (15)$$

$$\theta = \tan^{-1} x/y \quad (16)$$

$$\phi = \tan^{-1} l/h \quad (17)$$

The foregoing analysis, providing the flux at a chosen point, may be utilized to obtain an approximate numerical integration of the total flux built up by the source for a linear pass through the emitted distribution. The procedure is to choose parallel lines of travel offset and predetermined steps $y_1, y_2 \ldots y_n$ (FIG. 14) and further divide each line of travel into predetermined increments $x_1, x_2, \ldots x_n$. At each such incremental step on each chosen line of travel, the total flux $\alpha$ and the components $\alpha_v$, $\alpha_{H1}$ and $\alpha_{H2}$ are calculated. For each line, the data at each step are accumulated and totaled, thus providing a relative integration of the total flux deposited for a linear pass by the single source. It will be appreciated that the point-by-point procedure is lengthy and difficult to solve; hence, it has been found advantageous to utilize the foregoing line-by-line approach as seen with FIGS. 10 and 11 to obtain the $\alpha_v$ component. It will be recalled that this latter procedure yields the $\alpha_V$ component for an entire line of travel.

The point-by-point approach is also useful in assessing the contributions of a multiple source side-by-side array for the total flux for a linear pass of a work piece through their combined emitted distributions. Referring to FIG. 14, consider a simplified two source array having first and second sources $E_1$ and $E_2$ separated by a distance S perpendicular to the direction of travel. In calculating the total flux contributed by the second source $E_2$ and its components, the same expressions as above are used, except that the offset relative to the first source is $(S-y)$ rather than y; thus, the radial distance $l_2$ in the deposition plane is $$l_2^2 = (S-y)^2 + x^2 \quad (18)$$

Similarly, the angle $\phi_2$ made by the direction of the flux at point B to the vertical is $$\phi_2 = \tan^{-1} \frac{(S-y)}{h} \quad (19)$$

while the angle $\theta_2$ made by the perpendicular to the line of travel and the projection of the flux in the deposition plane is $$\theta_2 = \tan^{-1} \frac{x}{(S-y)} \quad (20)$$

Thus, the contribution for second and other sources of coverage are obtained and added together at each point x along each line of travel y to provide a numerical integration of the complete integrated collection of material from the full array. The evaluation may be simplified by setting the offset between lines of travel at 1" increments, and by choosing source separation S to be a whole number in inches. Then the flux along a line of travel due to two sources is $\alpha_n$, the contribution of the first source where n is the offset in inches from the first source, plus $\alpha_{(S-n)}$, the contribution of the second source.

An actual example of a tabulation of values of flux and flux components along one line of travel obtained through the above point-by-point analysis for the contributions from a first source is shown in Table B of the Appendix. The configuration tested is one where the radius of the source s=2.4, and h=10. This was previously identified by the earlier described line integral technique as a promising source height for uniformity of deposition. The line of travel being examined is at an offset $\Delta y=0.001$ (this is in lieu of examining the line of travel $\Delta y=0$ passing directly beneath the center of the source, for which the mathematics breaks down). Along this first line of travel, the flux components are calculated at 1" increments of $\Delta x$ (the first being at x=0.001 rather than x=0 because of the aforementioned mathematical singularity). As one moves sufficiently far away from the source, the contributions to the total deposited material become small enough to ignore. Thus, calculations are carried forth only to a $\Delta x$ of 16".

In interpreting Table B, it will be seen that at the first data point, almost directly beneath the source, the total flux $\alpha_T$ is as large as it can become; thus, it is considered one unit. All of it is in the form of the vertical component $\alpha_v$, which therefore is also one unit. Note that at all the data steps along this line of travel, the $\alpha_{H2}$ component, representing the deposition on the vertical surface A in the direction of the line of travel, is essentially non-existent, since the flux is considered as emanating from the center of the source, parallel to such surface. On the other hand, the $\alpha_{H1}$ component does increase to some point as the vertical surface orthogonal to the line of travel moves away from under the source, so that it may collect a component thereof. It will be noted that the total of the $\alpha_v$ component along the line of travel from x=0 to x=16" is only half of the actual total along that line of travel (since an equal amount will be accumulated from x=0 to x=−16". However, in the case of the $\alpha_{H1}$ component, the total of the components from X=0 to X=16 is the actual total, since the leading vertical surface is hidden from view of the source once it crosses under the source and begins to move away from the source. Accordingly, if the indicated total 7.384 is considered the total flux along the line of travel under consideration due to the vertical single source contribution, and is set equal to 100%, then 3.15, the indicated $\alpha_{H1}$ component total, is approximately 21%, on the same scale.

The operation as tabulated in Table B is then repeated in 1" increments of $\Delta y$ to obtain a similar set of data points for several other parallel lines of travel beneath the source. Again, the data are more easily obtained by utilizing the earlier line integral empirical technique to obtain the total integrated contribution for $\alpha_v$ along a complete line, and the present point-by-point approach is utilized for only the horizontal components $\alpha_{H1}$ and $\alpha_{H2}$.

As set forth above, the foregoing approach is easily adopted to add contributions from additional sources in the array. Table C is a simplified illustrative example for the data for the case of h=10" and L=12" geometry. If the deposition plane between the two sources is chosen to be analyzed into twelve lines of travel separated by 1" intervals, it will be necessary to tabulate only seven sets of values to obtain the flux components along all the lines of travel ranging from x=0.001 to x=12. Note that the vertical components and the $\alpha_{H1}$ components from both sources are additive and impinge on the same horizontal and leading vertical B faces, respectively. However, the side facing vertical A surface obtains coverage from only the first of the sources; similarly the $\alpha_{H2}$ component from the remaining sources coats only the vertical surface facing oppositely to the vertical A surface. Accordingly, the $\alpha_{H2}$ components from two non-adjacent sources are not added in the tabulation, unlike the vertical and $\alpha_{H1}$ components thereof.

Then in the first line of Table C, the three components due to the first and second sources for the line of travel at x=0.001 are listed (these were derived previously in Table B). The second line of Table C lists the three components due to first and second sources for the line of travel at x=12. Note that in the first line, $\alpha_{H2}$ =0 because the vertical A surface at x=0.001 is directly under the first source (while being totally shielded from the second source). However, we do have a $\alpha_{H2}$ entry in the second line, since the vertical A surface at x=12, though directly under the second source, does face the first source and receive a horizontal component from it. The third line of Table C represents the total flux component along the line of travel x=0.001, namely, 8.70 for the vertical component, 0 for $\alpha_{H2}$, and 3.82 for $\alpha_{H1}$. Note, however, that the same line also represents the total flux components along the line of travel x=12, except for the $\alpha_{H2}$ entry, which is instead 1.58, not 0, as just explained.

The fourth line of Table C comes about as follows. It is useful to express the relative flux values as normalized percentages, as will be apparent in plotting the values. Accordingly, the total vertical $\alpha_v$ component 8.70 directly under the first source (at X=0.001) is considered as 100%. Then the horizontal $\alpha_{H2}$ component for the line X=0.001 is 0%, and the horizontal $\alpha_{H1}$ component is 22%, in accordance with the treatment of Table B. In the fifth line of Table C, the same operation is done, except that the values represented in percentages are now those for the lines of travel at x=12. The above process is repeated six further times, with the vertical component entries obtained by way of the earlier described line-by-line techniques to reduce the problem to a practically solvable form, to obtain total component values and percentages for each of the remaining lines of travel, whereupon the Table C entries are then complete.

By calculations as in connection with Table C, complete three dimensional deposition data, and the degree of uniformity over both horizontal and vertical surfaces, may be obtained for multi-source arrays, in particular arrays 150, for various promising geometries seen with the original empirical technique. FIG. 16 plots the results for the geometry examined in simplified form in Table C. The associated FIGS. 15 and 17 show the results, (assuming a source separation L=12"), for the upper and lower ends of the range of h, at h=14" (FIG. 15) and h=8" (FIG. 17). These calculations of course continue to assume sources of diameter $\frac{1}{3}$ L to $\frac{1}{2}$ L.

We see that for both h=14" and h=10", the horizontal uniformity is highly satisfactory, being within a less than 10% deviation over all useful values of offset or horizontal position. The coverage on both the vertical surfaces presents more of a problem. It is only within a satisfactory range of uniformity over certain values of X; but if the "edge effect" discussed below is dealt with, both these geometries provide uniform coverage for all three dimensions. In the case of the h=8" configuration (FIG. 7), however, both horizontal and vertical coverages present large deviations at irregular offset positions, so that it cannot be a useful configuration for any degree of uniformity. Further investigations, even with other reasonable source-to-source separations, have shown that near the h=8" extreme of the height range, horizontal coverage continues to be unacceptably non-uniform.

Once the three-dimensional deposition curves for several geometries are plotted, as in FIGS. 15 through 17, it becomes apparent that the vertical A surface coverage near the edge of the work piece or a deposition plane does not build to an adequate fraction of the maximum flux until a certain distance inwardly offset from the first source (at X=0). This is of course true whenever we have an outboard source with no further source beyond it, and a corresponding edge of a distribution beneath the outboard source. This is not surprising, in view of the fact that only the first source can deliver a horizontal $\alpha_{H2}$ component to the vertical A surfaces, and that for vertical A surfaces nearly or directly under the source, the emitted flux will be generally parallel thereto. But we now have a graphic illustration of the exact variance of the coverage with distance, and as compared to the coverage of other surfaces.

In cases such as FIG. 17, for h=8", no such conclusion can be drawn. We see that vertical A side coverage increases quickly, but then declines drastically in the middle range of offset values before rising again. Within the vertical B coverage, a noticeable minimum is seen near the middle range of offset values, also giving rise to poor coverage. Thus, for values away from the edges, coverage is so non-uniform that the issue of edge coverage is moot, the configuration is not useful for vertical coverage just as in the horizontal case.

We can conclude from FIGS. 15 and 16 that with a 10" deposition distance, the platen carying workpieces to be coated must be positioned inwardly of the outboard source center by an offset of 2.5" before vertical A coverage for portions of the work piece near the edges adequately approaches its maximum of approximately 25% of the horizontal coverage. These parameters lead to a width of 34" for the platen 22 for the four-source arrays 150 of the actual system. The separation between centers of the outermost sources of 36", resulting in a platen inward offset of 1", and in the workpiece itself being inwardly offset another 1½" (see FIG. 7). Similarly in FIG. 15, with a 14" deposition distance, the platen must be inwardly offset relative to an outboard source center by a distance of 5" before a vertical A coverage near the side of the work piece becomes comparable to the remainder of the work piece. Because of the large offset, the geometry in this configuration, although an optimal one for uniformity of coverage, may not be as desirable as that of FIG. 16 from the view point of efficiency.

Thus, not only have the configurations for optimal horizontal and vertical A and B coverage been found through the foregoing techniques, but also the relative location of the edge of a platen to an outboard source for optimum vertical wall coverage is also obtained. For source-to-source separations of L=12", the range of acceptable inward offsets is from approximately 2½ to 5", depending on h. Similar ranges are developed for other source separations.

The foregoing considerations also affect the number of sources necessary to coat a wide workpiece adequately. From our earlier line-by-line approach considering only horizontal coverage, we could conclude that for platen width of 34", three sources with a separation of 12", and a deposition height of say 10 to 14" would coat a wide workpiece having only horizontal surfaces vary uniformly. This is confirmed by the uppermost curves of FIGS. 15 and 16. But once a side facing vertical A surface is found near the edge of a work piece, the edge affect becomes apparent, and for a 34" platen, and a corresponding wide workpiece thereon, four sources are needed, along with the proper degree of inward offset for the platen.

TABLE A

APPENDIX

Tabulated Values of $I_{(1, 2, 3)}$ for Various Source Separations

| s = | 1.0 | 1.2 | 1.4 | 1.6 | 1.8 | 2.0 | 2.2 |
|---|---|---|---|---|---|---|---|
| y = 0 | 2.15 | 1.95 | 1.76 | 1.60 | 1.40 | 1.00 | 1.00 |
| .1 | 2.23 | 1.93 | 1.75 | 1.58 | 1.38 | 1.00 | 0.98 |
| .2 | 2.23 | 1.92 | 1.74 | 1.55 | 1.26 | 1.17 | 0.98 |
| .3 | 2.22 | 2.01 | 1.72 | 1.51 | 1.29 | 1.20 | 1.09 |
| .4 | 2.18 | 2.02 | 1.70 | 1.40 | 1.30 | 1.22 | 1.13 |
| .5 | 2.14 | 2.00 | 1.76 | 1.42 | 1.32 | 1.24 | 1.15 |
| .6 | 2.10 | 1.96 | 1.67 | 1.45 | 1.35 | 1.26 | 1.18 |
| .7 | 2.05 | 1.89 | 1.70 | 1.57 | 1.38 | 1.27 | 1.19 |
| .8 | 1.96 | 1.72 | 1.67 | 1.59 | 1.37 | 1.27 | 1.17 |
| .9 | 1.84 | 1.67 | 1.62 | 1.57 | 1.44 | 1.25 | 1.14 |
| 1.0 | 1.58 | 1.54 | 1.50 | 1.45 | 1.37 | 1.15 | 1.05 |
| 1.1 | 1.51 | 1.51 | 1.47 | 1.42 | 1.38 | 1.25 | 1.05 |
| 1.2 | 1.44 | 1.47 | 1.44 | 1.40 | 1.35 | 1.27 | 1.05 |
| 1.3 | 1.37 | 1.41 | 1.41 | 1.37 | 1.32 | 1.27 | 1.14 |
| 1.4 | 1.30 | 1.35 | 1.38 | 1.35 | 1.30 | 1.26 | 1.17 |
| 1.5 | 1.24 | 1.29 | 1.32 | 1.32 | 1.29 | 1.24 | 1.19 |
| 1.6 | 1.18 | 1.22 | 1.26 | 1.30 | 1.26 | 1.22 | 1.18 |
| 1.7 | 1.10 | 1.15 | 1.20 | 1.24 | 1.24 | 1.20 | 1.15 |
| 1.8 | 1.00 | 1.08 | 1.13 | 1.17 | 1.20 | 1.17 | 1.13 |
| 1.9 | 0.86 | 0.99 | 1.04 | 1.09 | 1.12 | 1.12 | 1.09 |
| 2.0 | 0.58 | 0.79 | 0.88 | 0.92 | 0.97 | 1.00 | 0.97 |
| 2.1 | 0.52 | 0.72 | 0.85 | 0.90 | 0.95 | 0.98 | 0.98 |
| 2.2 | 0.47 | 0.58 | 0.79 | 0.88 | 0.92 | 0.97 | 1.00 |
| 2.3 | 0.42 | 0.52 | 0.72 | 0.85 | 0.90 | | 0.98 |
| 2.4 | 0.38 | 0.47 | 0.58 | 0.79 | | | 0.97 |
| 2.5 | 0.34 | 0.42 | 0.52 | | | | 0.95 |
| 2.6 | 0.30 | 0.38 | 0.47 | | | | 0.92 |
| 2.7 | 0.25 | 0.34 | | | | | 0.90 |
| 2.8 | 0.20 | 0.30 | | | | | 0.88 |
| 2.9 | 0.14 | 0.25 | | | | | 0.85 |
| 3.0 | 0 | 0.20 | | | | | 0.79 |
| 3.1 | 1.24 | 0.14 | | | | | 0.72 |
| | 0.75 | | | | | | |
| 3.2 | | 0 | | | | | 0.58 |
| 3.3 | | 1.16 | | | | | |
| | | 1.65 | | | | | |
| 3.4 | | | | | | | |
| 3.5 | | | | | | | |

| s = | 2.4 | 2.6 | 2.8 | 3.0 | 3.2 | 3.4 |
|---|---|---|---|---|---|---|
| y = 0 | 1.00 | 1.00 | | | | |
| .1 | 0.98 | 0.98 | | | | |
| .2 | 0.97 | 0.97 | | | | |
| .3 | 0.95 | 0.95 | | | | |
| .4 | 0.92 | 0.92 | | | | |
| .5 | 1.04 | 0.90 | | | | |
| .6 | 1.08 | 0.88 | | | | |
| .7 | 1.10 | 0.99 | 0.85 | | | |
| .8 | 1.09 | 1.00 | 0.79 | 0.79 | | |
| .9 | 1.06 | 0.97 | 0.86 | 0.72 | | |
| 1.0 | 0.95 | 0.87 | 0.78 | 0.58 | 0.58 | 0.58 |
| 1.1 | 0.95 | 0.86 | 0.78 | 0.66 | 0.52 | 0.52 |
| 1.2 | 0.95 | 0.85 | 0.77 | 0.67 | 0.47 | 0.47 |
| 1.3 | 0.95 | 0.85 | 0.76 | 0.68 | 0.56 | 0.42 |
| 1.4 | 0.95 | 0.85 | 0.76 | 0.68 | 0.58 | 0.38 |
| 1.5 | 1.06 | 0.86 | 0.76 | 0.68 | 0.59 | 0.48 |
| 1.6 | 1.09 | 0.87 | 0.77 | 0.68 | 0.60 | 0.50 |
| 1.7 | 1.10 | 0.97 | 0.78 | 0.68 | 0.59 | 0.50 |
| 1.8 | 1.08 | 1.00 | 0.78 | 0.67 | 0.58 | 0.50 |
| 1.9 | 1.04 | 0.99 | 0.86 | 0.66 | 0.56 | 0.48 |
| 2.0 | 0.92 | 0.88 | 0.79 | 0.58 | 0.47 | 0.38 |
| 2.1 | 0.94 | 0.90 | 0.85 | 0.72 | | 0.42 |
| 2.2 | 0.97 | 0.92 | | 0.79 | | 0.47 |
| 2.3 | 0.98 | 0.95 | | | | 0.52 |
| 2.4 | 1.00 | 0.97 | | 0.88 | | |
| 2.5 | 0.98 | 0.98 | | | | |
| 2.6 | 0.97 | 1.00 | | 0.92 | | |
| 2.7 | 0.95 | 0.98 | | | | |
| 2.8 | 0.92 | 0.97 | 1.00 | 0.97 | | |
| 2.9 | 0.90 | 0.95 | | | | |
| 3.0 | 0.88 | 0.92 | | 1.00 | | |
| 3.1 | 0.85 | 0.90 | | | | |
| 3.2 | 0.79 | 0.88 | | 0.97 | | |
| 3.3 | 0.72 | 0.85 | | | | |
| 3.4 | 0.58 | 0.79 | | 0.92 | | |
| 3.5 | 0.52 | 0.72 | | | | |

TABLE A-continued

APPENDIX
Tabulated Values of $I_{(1, 2, 3)}$ for Various Source Separations

| | |
|---|---|
| 3.6 | 0.88 |

TABLE B

Flux Components From One Source At Incremental Data Points Along the Line of Travel Directly Beneath Source, For s = 2.4, h = 10

| Location of Data Point | | $\alpha_T$ | $\alpha_V$ | $\alpha_{H2}$ | $\alpha_{H1}$ |
|---|---|---|---|---|---|
| y = .001, | y = .001 | 1.00 | 1.000 | | |
| x = 1.0, | y = .001 | 0.98 | 0.979 | $9.7^{-5}$ | 0.098 |
| x = 2.0, | y = .001 | 0.014 | 0.921 | $9.2^{-5}$ | 0.184 |
| x = 3.0, | y = .001 | 0.87 | 0.833 | $8.5^{-5}$ | 0.250 |
| x = 4.0, | y = .001 | 0.78 | 0.727 | $7.2^{-5}$ | 0.291 |
| x = 5.0, | y = .001 | 0.689 | 0.616 | $6^{-5}$ | 0.308 |
| x = 6.0, | y = .001 | | 0.508 | $5^{-5}$ | 0.305 |
| x = 7.0, | y = .001 | 0.502 | 0.411 | $4^{-5}$ | 0.288 |
| x = 8.0, | y = .001 | 0.420 | 0.328 | $3^{-5}$ | 0.262 |
| x = 9.0, | y = .001 | 0.348 | 0.259 | $2^{-5}$ | 0.233 |
| x = 10, | y = .001 | 0.278 | 0.203 | $2^{-5}$ | 0.203 |
| x = 11, | y = .001 | 0.236 | 0.159 | $1.5^{-5}$ | 0.175 |
| x = 12, | y = .001 | 0.195 | 0.125 | $1.2^{-5}$ | 0.150 |
| x = 13, | y = .001 | 0.160 | 0.098 | $.9^{-5}$ | 0.127 |
| x = 14, | y = .001 | 0.133 | 0.077 | $7^{-6}$ | 0.108 |
| x = 15, | y = .001 | 0.110 | 0.061 | $6^{-6}$ | 0.091 |
| x = 16, | y = .001 | 0.092 | 0.049 | $4^{-6}$ | 0.078 |
| | | | 7.384 | | 3.151 |
| | | | 100% | 0% | 21% |

TABLE C

Flux Components Due to Two Sources Where h = 10" and l = 12", For:

| Line At Position x = | Source At Position x = | $\alpha_V$ | Vertical A Surface $\alpha_{H2}$ | Vertical B Surface $\alpha_{H1}$ |
|---|---|---|---|---|
| | 0 | 7.38 | 0 | 3.15 |
| | 12 | 1.32 | 1.58 | 0.67 |
| | | 8.70 | | 3.82 |
| 0 | | 100% | 0% | 22% |
| 12 | | 100% | 18% | 22% |
| | 1 | 7.29 | 0.73 | 3.23 |
| | 11 | 1.62 | 1.84 | 0.90 |
| | | 8.91 | | 4.13 |
| 1 | | 102% | 8% | 24% |
| 11 | | 102% | 21% | 24% |
| | 2 | 6.92 | 1.38 | 3.09 |
| | 10 | 2.09 | 2.09 | 1.08 |
| | | 9.01 | | 4.17 |
| 2 | | 104% | 16% | 24% |
| 10 | | 104% | 24% | 24% |
| | 3 | | 1.90 | |
| | 9 | | 2.12 | |
| | | 8.70 | | 4.14 |
| 3 | | 100% | 22% | 24% |
| 9 | | 100% | 24% | 24% |
| | 4 | | 2.26 | 2.62 |
| | 8 | | 2.30 | 1.49 |
| | | 8.53 | | 4.11 |
| 4 | | 98% | 26% | 24% |
| 8 | | 98% | 26% | 24% |
| | 5 | | 2.68 | |
| | 7 | | 2.41 | |
| | | 8.39 | | 3.99 |
| 5 | | 96% | 28% | 29% |
| 7 | | 96% | 28% | 29% |
| | 6 | | | |
| | 6 | | 2.50 | |
| | | 8.36 | | 3.86 |
| 6 | | 96% | 29% | 22% |
| 6 | | 96% | 29% | 22% |

What is claimed is:

1. High throughput sputter coating system for coating workpieces carried by an internal chamber conveyer which has a width several times the diameter of an individual sputtering source, and capable of interfacing with input and output conveyor means and air locks, comprising:

a vacuum processing chamber having an entrance opening and an exit opening at opposite ends thereof;

internal chamber conveyor means for carrying workpieces, said conveyor means extending between said entrance and exit openings;

a first plurality of sputtering sources mounted within said vacuum processing chamber above said internal conveyor means and extending in a side-by-side array transversely to the direction of said internal conveyor means;

first and second isolation valve means sealing said entrance and exit openings of said processing chamber, each of said isolation valves including a wide plate-like gate of width at least that of said internal conveyor means, and sealingly overlappable with the corresponding chamber opening, an elongated member affixed transversely across said gate and extending beyond the edges of said gate, means for supporting said gate at the ends of said elongated member, said means adapted to permit upward and downward movement in a first direction parallel to said chamber opening and limited inward and outward movement in a second direction normal to said chamber opening, means acting at the ends of said elongated member for applying closure force to said gate inwardly in said second direction toward said chamber opening, means connected to said elongated member for moving said gate up and down along said means supporting said gate; whereby said system may interface with input and output conveyors and air locks to accept workpieces which are advanced at high throughput rates through said valve means and into said chamber.

2. A system as in claim 1, in which said sources are spaced from one another a center-to-center distance L, and said sources are spaced a distance H from said internal chamber conveyor means, said dimensions being related in accordance with the following relationship $$2L/H = S$$

where S ranges from approximately 1.6 to 3.0.

3. A system as in claim 2, in which H is a maximum of 14 inches, and the diameter of each source lies within the range of 4 to 5 inches.

4. A system as in claim 3 in which S ranges from 1.7 to 2.4.

5. A claim as in claim 1 in which said array includes four sputtering sources.

6. A system as in claim 5 in which a plurality of said arrays are included in said processing chamber, each array being positioned serially one after the other along the direction of travel of said internal conveyer and in registration with each other.

7. A system as in claim 6 which is so adapted that at least one of said arrays is not operated, while selected sources of said one array are operated in the event of a corresponding source in another array becoming inoperative.

8. A system as in claim 1 in which said sources are mounted to said processing chamber with thin adjustable support means for allowing each source to be repositioned up and down relative to said conveyer means to accommodate workpieces of irregular height.

9. A system as in claim 1 in which said array of sputtering sources is an arcuate array above said internal conveyer means, for more evenly coating workpieces curving centrally upwardly.

* * * * *